US010249643B2

(12) United States Patent
Tada

(10) Patent No.: US 10,249,643 B2
(45) Date of Patent: Apr. 2, 2019

(54) HARD COPIED SEMICONDUCTOR DEVICE HAVING A RESISTANCE-VARIABLE NON-VOLATILE ELEMENT

(71) Applicant: NEC CORPORATION, Tokyo (JP)

(72) Inventor: Munehiro Tada, Tokyo (JP)

(73) Assignee: NEC CORPORATION, Minato-ku, Tokyo (JP)

( * ) Notice: Subject to any disclaimer, the term of this patent is extended or adjusted under 35 U.S.C. 154(b) by 7 days.

(21) Appl. No.: 15/318,792

(22) PCT Filed: Jun. 19, 2015

(86) PCT No.: PCT/JP2015/003082
§ 371 (c)(1),
(2) Date: Dec. 14, 2016

(87) PCT Pub. No.: WO2015/198573
PCT Pub. Date: Dec. 30, 2015

(65) Prior Publication Data
US 2017/0141125 A1    May 18, 2017

(30) Foreign Application Priority Data
Jun. 25, 2014  (JP) ................. 2014-130223

(51) Int. Cl.
*H01L 27/24*   (2006.01)
*H01L 27/11*   (2006.01)
(Continued)

(52) U.S. Cl.
CPC .... *H01L 27/11807* (2013.01); *G06F 17/5068* (2013.01); *H01L 27/101* (2013.01);
(Continued)

(58) Field of Classification Search
CPC . H01L 27/24; H01L 27/2436; H01L 27/2463; H01L 27/11888; H01L 45/1206
See application file for complete search history.

(56) References Cited

U.S. PATENT DOCUMENTS

| 7,492,033 B2 * | 2/2009 | Sato | ................. G11C 11/5678 257/401 |
| 7,554,147 B2 * | 6/2009 | Asano | ................. G11C 13/0004 257/296 |

(Continued)

FOREIGN PATENT DOCUMENTS

| JP | 2000-068378 A | 3/2000 |
| JP | 2007-005580 A | 1/2007 |
| JP | 2008-219011 A | 9/2008 |

OTHER PUBLICATIONS

International Search Report for corresponding application No. PCT/JP2015/003082 dated Jul. 21, 2015.
(Continued)

*Primary Examiner* — Ida M Soward
(74) *Attorney, Agent, or Firm* — Sughrue Mion, PLLC

(57) ABSTRACT

Provided are a semiconductor device and a method of manufacturing the semiconductor device which enable a hard copy of a reconfigurable circuit, which employs a resistance variable element, to be formed at low cost. The method of manufacturing a semiconductor device is for manufacturing a hard copy from a reconfigurable circuit chip that employs a resistance-variable non-volatile element formed inside a multi-layered wiring layer on a semiconductor substrate, wherein the hard copy is manufactured by using a semiconductor substrate base that is the same as that of the semiconductor substrate for forming the reconfigurable circuit chip.

9 Claims, 11 Drawing Sheets

(51) Int. Cl.
*H01L 27/118* (2006.01)
*G06F 17/50* (2006.01)
*H01L 45/00* (2006.01)
*H01L 27/10* (2006.01)

(52) U.S. Cl.
CPC .......... *H01L 27/24* (2013.01); *H01L 27/2436* (2013.01); *H01L 27/2463* (2013.01); *H01L 45/08* (2013.01); *H01L 45/1206* (2013.01); *H01L 2027/11838* (2013.01); *H01L 2027/11875* (2013.01)

(56) References Cited

U.S. PATENT DOCUMENTS

| | | | | |
|---|---|---|---|---|
| 7,605,079 | B2* | 10/2009 | Lai | H01L 27/2436 438/128 |
| 8,203,135 | B2* | 6/2012 | Sim | H01L 27/24 257/350 |
| 8,258,038 | B2* | 9/2012 | Nozawa | H01L 27/101 257/E21.004 |
| 8,338,817 | B2* | 12/2012 | Moniwa | H01L 27/2436 257/2 |
| 8,981,327 | B1* | 3/2015 | Mathur | H01L 45/00 257/2 |
| 9,183,914 | B2* | 11/2015 | Owada | G11C 14/009 |
| 2006/0289943 | A1 | 12/2006 | Yamada | |
| 2008/0211540 | A1 | 9/2008 | Fujita | |
| 2009/0102598 | A1* | 4/2009 | Yamazaki | H01L 45/04 338/20 |
| 2011/0049465 | A1* | 3/2011 | Nagashima | H01L 27/0207 257/5 |
| 2011/0101431 | A1* | 5/2011 | Takeuchi | H01L 21/76826 257/295 |
| 2011/0199812 | A1* | 8/2011 | Kitagawa | G11C 7/1048 365/148 |
| 2013/0037777 | A1* | 2/2013 | Mikawa | H01L 21/76807 257/4 |
| 2013/0056701 | A1* | 3/2013 | Mikawa | G11C 13/0007 257/4 |
| 2014/0197368 | A1* | 7/2014 | Yoneda | H01L 45/08 257/2 |
| 2015/0340609 | A1* | 11/2015 | Banno | H01L 45/085 257/4 |

OTHER PUBLICATIONS

M. Tada et al. "Polymer Solid-Electrolyte (PSE) Switch Embedded on CMOS for Nonvolatile Crossbar Switch", IEEE Transactions on Electron Devices, vol. 58, No. 12, pp. 4398-4406, (Dec. 2011).

* cited by examiner

RESISTANCE VARIABLE ELEMENT

ARRANGEMENT THAT UPPER-LAYER WIRING AND LOWER-LAYER WIRING OVERLAP IN ADVANCE

HARD COPIED SEMICONDUCTOR DEVICE HAVING A RESISTANCE-VARIABLE NON-VOLATILE ELEMENT

TECHNICAL FIELD

The present invention relates to a semiconductor device and a method of manufacturing the semiconductor device, and particularly, relates to a method of manufacturing a hard copy from a semiconductor device on which a memory and a field-programmable gate array including a resistance-variable non-volatile element are mounted inside a multi-layered wiring layer.

BACKGROUND ART

A resistance-variable non-volatile element is hereinafter referred to as a "resistance variable element". A semiconductor device including a silicon device has been progressed in device integration and lower electric power consumption by miniaturization in a scaling law known as Moore's law, and has been developed at a pace of "aiming for quadrupling integration every three years". Recent years have seen a metal oxide semiconductor field effect transistor (MOSFET) with a gate length of 20 nm or less, which causes a rise in a cost of a lithography process and a physical limit on a device dimension. Hence, improvement of a device performance with an approach different from the conventional scaling law is being desired.

Examples of a rise in a cost of a lithography process include a rise in prices of a manufacturing apparatus and a mask set. In addition, examples of a physical limit on a device dimension include an operating limit and a dimensional variation limit.

In recent years, a rewritable programmable logic device called a field programmable gate array (FPGA) or a programmable logic device (PLD) has been developed, which is positioned as an intermediate between a gate array and a standard cell. The FPGA allows a customer to configure a circuit arbitrarily by himself/herself after manufacture of a chip, and purchase is available for one chip at minimum. A common FPGA, which often uses a static random access memory (SRAM) and a pass transistor (or a flash-type transistor) as a routing switch in a reconfigurable circuit, has a large chip area and consumes a large amount of electric power. In addition, it is necessary to program a chip one by one after manufacturing the chip, and as a result, there is a problem that a chip cost is high.

Consequently, when a certain number of chips once functionally verified by an FPGA are required, there is a case of using a method of reprinting the same logical operation function on an application specific integrated circuit (ASIC) (called hard copy, master slice, and the like). Since a circuit function of a hard copy is determined by a layout of a wiring and a via plug in a manufacture process, a programming process after manufacture of a chip is unnecessary, which enables cost reduction.

Methods for hard copy include two ways: (1) a method in which a layout of a reconfigurable circuit is used as is; and (2) a method in which a circuit layout is redesigned as an ASIC achieving the same function. In (1), although a chip cost is lowered by elimination of a programming process, electric power consumed by a chip is approximately equivalent compared to a reconfigurable circuit before hard copy. In (2), despite a cost increase due to ASIC design and a novel cost for a reticle set, there is a benefit of reducing a chip size and reducing electric power consumption.

On the other hand, as a method of reducing electric power consumption of an FPGA, an FPGA of a type including a resistance-variable element inside a multi-layered wiring layer has been studied, in which the resistance variable element can be used for a routing switch and a memory.

As for an FPGA of a type including a resistance-variable element inside a multi-layered wiring layer, examples of the resistance variable element include a resistance random access memory (resistance RAM (ReRAM)) using a transition metal oxide, a NanoBridge (Registered Trademark) using an ion conductor, and the like. The ion conductor is a solid in which ions can freely move by application of electric field or the like.

Non-patent literature 1 (NPL1) discloses, as a resistance variable element with high possibility of enhancing a degree of freedom in a circuit, a switching element using metal ion translocation and electrochemical reaction in an ion conductor. The switching element disclosed in NPL1 is constituted of three layers of an ion conductive layer, and a first electrode and a second electrode which are provided respectively in contact with two faces of the ion conductive layer. The first electrode among these has a role for supplying the ion conductive layer with metal ions. The second electrode does not supply any metal ions.

An operation of the switching element is briefly described. When the first electrode is grounded and negative voltage is applied to the second electrode, a metal of the first electrode becomes a metal ion and dissolves in the ion conductive layer. The metal ion in the ion conductive layer then precipitates as being a metal in the ion conductive layer, and the precipitated metal forms a metal crosslink connecting the first electrode with the second electrode. By electrically connecting the first electrode with the second electrode by the metal crosslink, a switch enters an ON state.

On the other hand, when the first electrode is grounded and positive voltage is applied to the second electrode in the ON state, part of the metal crosslink is disconnected. Accordingly, the electrical connection between the first electrode and the second electrode is broken, and the switch enters an OFF state. Note that there are changes in electrical properties before the electrical connection is completely broken, such as an increase in resistance between the first electrode and the second electrode and a change in inter-electrode capacity, so that the electrical connection is eventually broken. In addition, in order to turn the OFF state to an ON state, the first electrode may be again grounded and negative voltage may be applied to the second electrode.

NPL1 discloses a configuration and an operation of a two-terminal type switching element having two electrodes with an ion conductor interposed therebetween and controlling a conduction state therebetween.

By using a reconfigurable circuit using the resistance variable elements, a chip size is reduced and electric power consumption can be also reduced compared with a conventional FPGA.

CITATION LIST

Non Patent Literature

[NPL1] M. Tada, K. Okamoto, T. Sakamoto, M. Miyamura, N. Banno, and H. Hada, "Polymer Solid-Electrolyte (PSE) Switch Embedded on CMOS for Nonvolatile Crossbar Switch", IEEE Transactions on Electron Devices, vol. 58, no. 12, pp. 4398-4405, (2011).

SUMMARY OF INVENTION

Technical Problem

In general, an ASIC, which requires a dedicated mask set, is characterized by a large initial investment cost (one to two hundred million yen) and is effective when a large number of chips are necessary. In contrast, when a small number as much as, for example, several thousand to several ten thousand of chips are needed, a fixed cost for a mask set is higher than a variable cost for manufacturing a chip, and hence, there is a problem that, despite a reduced chip size, a unit price of a chip is higher than that of an FPGA.

On the other hand, when an FPGA is continually used rather than using an ASIC, there is a benefit in that test and verification of a designed circuit are possible by use of an actual chip, and that purchase is available for one chip at minimum. In contrast, a unit price of a chip is high, and when ten thousand of chips are needed, it is necessary to program ten thousand of FPGAs individually. Since a testing cost thereof is imposed, there is a problem that, even when the number of chips is increased, a cost cannot be lowered.

Contrary to this, an FPGA of a type using a resistance variable element has a benefit of a smaller area and lower electric power consumption than a conventional FPGA. However, since programming is still necessary at least once for each one of chips, there has been a problem that, when a large number of chips are necessary, a unit price for a chip becomes high because of a higher testing cost than that of an ASIC.

Thus, in a product requiring a scale of several thousand to several ten thousand of chips, which is classified as what is called a long tail, a method of manufacturing a low-cost and low-electric-power chip has been desired.

An object of the present invention is to provide a semiconductor device and a method of manufacturing the semiconductor device which enable a hard copy of a reconfigurable circuit using a resistance variable element to be formed at low cost.

Solution to Problem

To achieve the object, a hard copy semiconductor device according to the present invention includes a semiconductor substrate base which includes a circuit configuration being same as that of the reconfigurable circuit provided with a resistance variable element and does not include a program mechanism for programming a resistance variable element, identifies in advance a position to program a resistance variable element necessary for desired arithmetic processing, and fabricates a low-resistance-state resistance variable element as a via plug by a semiconductor process.

The hard copy semiconductor device can be manufactured by using a technology node being further miniaturized than the reconfigurable circuit provided with a resistance variable element.

In addition, a method of manufacturing a semiconductor device according to the present invention is a method of manufacturing a hard copy from a reconfigurable circuit chip using a resistance-variable non-volatile element formed inside a multi-layered wiring layer on a semiconductor substrate, wherein the hard copy is manufactured by using a semiconductor substrate base which includes a circuit configuration being same as that of the semiconductor substrate forming the reconfigurable circuit chip and does not include a program mechanism for programming a resistance variable element.

Alternatively, as another exemplary embodiment for achieving the object, a hard copy semiconductor device according to the present invention uses a semiconductor substrate base being same as that of the reconfigurable circuit provided with a resistance variable element, identifies in advance a position to program a resistance variable element necessary for desired arithmetic processing during mapping, and fabricates a low-resistance-state resistance variable element as a via plug by a semiconductor process without forming a resistance variable element.

To achieve the above-mentioned object, a semiconductor device according to the present invention is a semiconductor device including a lower wiring formed on a semiconductor substrate, an interlayer-insulating film formed above the lower wiring, an upper wiring formed above the interlayer-insulating film at a position planarly overlapping with the lower wiring, and a resistance variable element formed between the lower wiring and the interlayer-insulating film at a position where the lower wiring and the upper wiring planarly overlap, wherein the resistance-variable non-volatile element including a resistance variable layer is formed at a position where the lower wiring and the upper wiring planarly overlap, the resistance-variable non-volatile element includes a wiring serving as a lower electrode, the resistance variable layer, and an upper electrode, and is configured such that the resistance variable layer is connected with the wiring serving as a lower electrode through an opening part of an insulating barrier film provided on the wiring serving as a lower electrode and the upper electrode is connected with an upper wiring through a contact plug, and the resistance-variable non-volatile element is not formed, and the lower wiring and the upper wiring are short-circuited, at a first portion of a position where the lower wiring and the upper wiring planarly overlap.

In addition, a method of manufacturing a semiconductor device according to the present invention is a method of manufacturing a hard copy from a reconfigurable circuit chip using a resistance-variable non-volatile element formed inside a multi-layered wiring layer on a semiconductor substrate, wherein the hard copy is manufactured by using a semiconductor substrate base being same as that of a semiconductor substrate forming the reconfigurable circuit chip.

Advantageous Effect of Invention

The present invention enables a hard copy of a reconfigurable circuit using a resistance variable element to be formed at low cost, and is able to achieve both a lower electric power and a lower cost of a chip at the same time.

Further, since a reconfigurable circuit using a resistance variable element may be used to carry out an accurate operation check in advance as to whether desired arithmetic processing is performed, a redesigning cost (Non-recurring Cost) for performing hard copy can be reduced.

DESCRIPTION OF EMBODIMENTS

Figure 1:
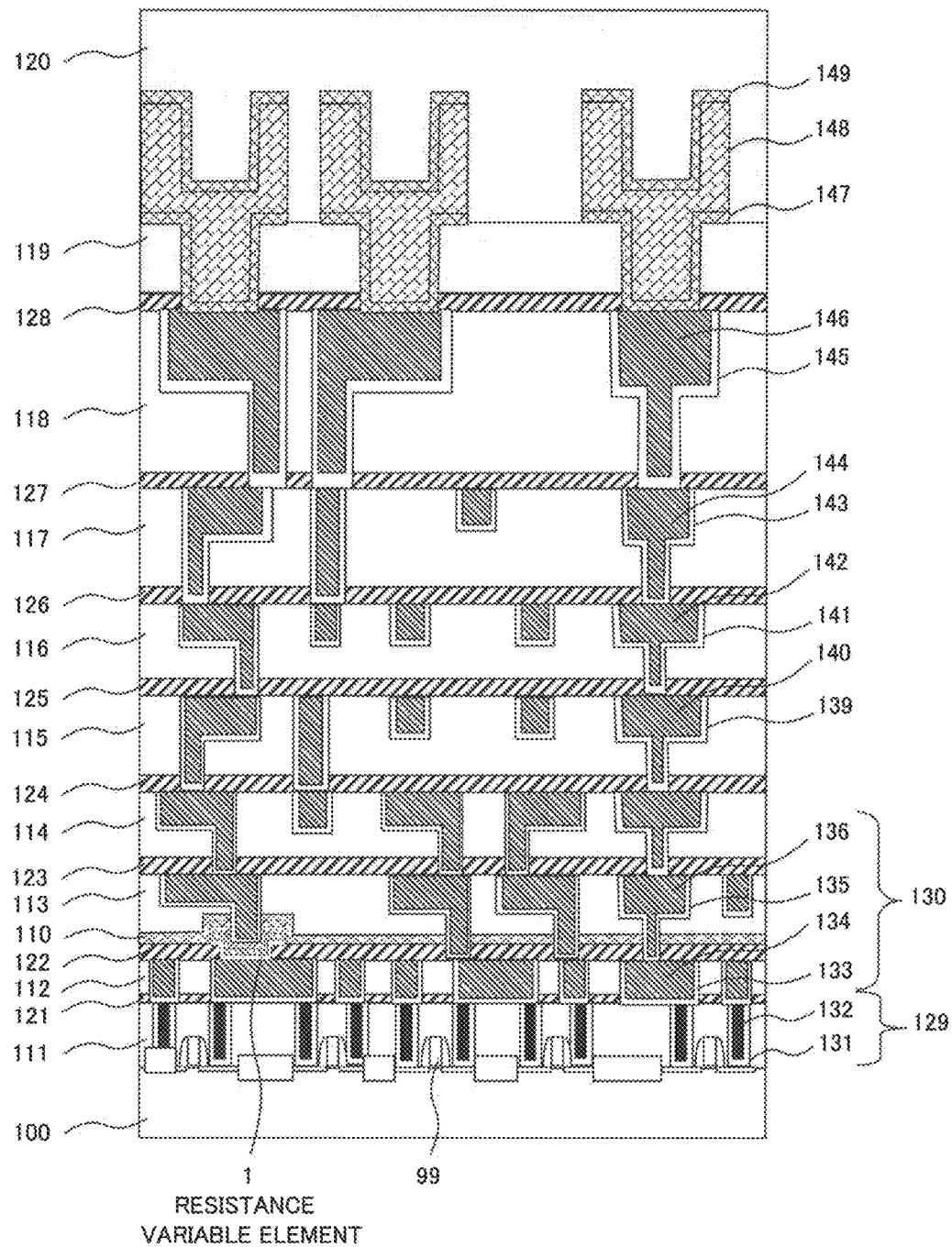
FIG. 1 is a sectional view schematically illustrating a configuration example of a semiconductor device according to a first exemplary embodiment of the present invention.

The following describes a summary of the present invention before describing exemplary embodiments of the present invention.

(Concept of Hard Copying Reconfigurable Circuit Using Resistance Variable Element)

The present invention is a method of manufacturing a hard copy of a reconfigurable circuit chip using a resistance variable element formed inside a multi-layered wiring layer on a semiconductor substrate. One aspect of the present invention is for acquiring configuration information for achieving a desired operation function from a reconfigurable circuit chip, and manufacturing a hard copy on another semiconductor substrate base having a circuit configuration same as that of a semiconductor substrate. The configuration information achieving a desired operation function from a reconfigurable circuit chip indicates, for example, a position of a wiring to be connected or disconnected depending on arrangement of a resistance variable element to be programmed.

Another aspect of the present invention is a method of manufacturing a hard copy of a reconfigurable circuit chip using a resistance variable element formed inside a multi-layered wiring layer on a semiconductor substrate, wherein a hard copy may be manufactured by using a semiconductor substrate base same as that of the semiconductor substrate forming the reconfigurable circuit chip.

This can achieve both a low-power property of a reconfigurable chip using a resistance variable element and a reduction in a programming cost by a hard copy at the same time. Since it is possible to perform functional verification in advance with use of a reconfigurable chip using a resistance variable element and hard copy the verified function, a design cost can also be reduced. In addition, since a reconfigurable circuit chip and a hard copy can use the same semiconductor substrate base, there is also an advantage that an initial cost (cost for a reticle set) at a time of manufacturing the hard copy can be made zero.

Another aspect of the present invention provides a method of manufacturing a semiconductor device, which is characterized in that only a single mask is changed in a multi-layered wiring process according to the method of manufacturing a hard copy. As a base for a complementary metal oxide semiconductor (CMOS) at a time of manufacturing a hard copy, a semiconductor substrate base having a circuit mechanism same as that of a reconfigurable circuit chip is prepared in advance so that a via plug can be formed at a portion where a non-volatile resistance variable element has been arranged. Accordingly, forming a semiconductor device in a short turn-around-time (TAT) as well as implementing various arithmetic devices merely by changing a single mask becomes possible.

(Limitation on Way to Use Resistance Variable Element)

Another aspect of the present invention provides a method of manufacturing a semiconductor device, which is characterized in that only a single mask is changed in a multi-layered wiring process according to the method of manufacturing a hard copy. This enables a CMOS base at a time of manufacturing a hard copy to be formed not only by using a semiconductor substrate base same as that of a reconfigurable circuit chip, but also by applying most of existing reticle sets, and hence, an initial cost is lowered and a chip cost can be reduced.

(Way to Use Resistance Variable Element 1)

Still another aspect of the present invention is characterized in that the resistance variable element is used as a routing switch or a memory. The functions thereof are electrically implementable as an ON/OFF state or a 0/1 state when manufacturing an electrical short circuit/insulation state in a manufacture process.

(Way to Use Resistance Variable Element 2)

Still another aspect of the present invention is characterized in that the resistance variable element is programmed through a cell transistor.

(Basic Configuration of Method for Hard Copy)

Still another aspect of the present invention is a method of manufacturing a hard copy of a reconfigurable circuit using a resistance variable element, wherein the hard copy is manufactured in a manufacture process in such a manner that a switch programmed to be in a low-resistance state is electrically short-circuited and that a switch programmed to be in a high-resistance state is electrically insulated.

More specifically, in a method of forming a short circuit state and an insulation state of the resistance variable element, a position of the resistance variable element programmed to a low-resistance state during mapping of a reconfigurable circuit is specified. Then, a circuit layout at a time of manufacturing a hard copy is formed in such a manner that a via plug is formed at a position of the low-resistance state element and that a via plug is not formed at a position of the high-resistance state element.

As a semiconductor substrate base used in a hard copy, a semiconductor substrate base same as that when a reconfigurable circuit using a resistance variable element is formed may be used, or another semiconductor substrate base from which a program mechanism has been eliminated may be used. When the same one is used, a design layout can be applied, and when the one from which a program mechanism has been eliminated is used, a layout with a smaller area can be used.

Consequently, since a connection state to achieve a function in a hard copy is implemented by a via plug, reliability is greatly improved as compared with the case when a resistance variable element is used. As for temperature stability, for example, a guaranteed temperature of a chip in terms of long-term storage reliability is approximately 80 to 125° C. when a resistance variable element is used, whereas a guaranteed temperature of a chip in a hard copy may possibly be up to 180° C.

(Method for Hard Copy with Resistance Variable Element Part Equipped Thereon)

Further another aspect of the present invention is the resistance variable element which includes a wiring serving as a lower electrode, a resistance variable layer, and an upper electrode. The configuration is such that the resistance variable layer is connected with the wiring serving as a lower electrode through an opening part of an insulating barrier film provided on the wiring serving as a lower electrode, and the upper electrode is connected with the upper wiring through a contact plug. At a time of manufacturing a hard copy, a mask for forming the opening part on the insulating barrier film, or a mask for forming a via plug for connecting the upper electrode and the upper wiring is changed, and a resistance variable element part implements a circuit operation in a state in which only an electrode layer excluding the resistance variable layer is mounted.

(Method for Hard Copy without Resistance Variable Element Equipped Thereon)

Further another aspect of the present invention is the resistance variable element which includes a wiring serving as a lower electrode, a resistance variable layer, and an upper electrode. The configuration is such that the resistance variable layer is connected with the wiring serving as a lower electrode through an opening part of an insulating barrier film provided on the wiring serving as a lower electrode, and the upper electrode is connected with the upper wiring through a contact plug. At a time of manufacturing a hard copy, a process of manufacturing the resistance variable element is eliminated, and the hard copy is manufacturing using a method whereby a mask for forming a via plug for connecting the upper electrode and the upper wiring is changed. Further, the semiconductor device is a semiconductor device on which a resistance variable element is mounted, which is characterized by having such an arrangement that the wiring serving as a lower electrode and the upper wiring overlap each other in a direction vertical to a substrate in such a manner that a via plug can be formed in advance.

(Disconnection of Cell Transistor at Time of Manufacturing of Hard Copy)

Further another aspect of the present invention is a method of changing a mask for forming a contact plug for connecting the upper electrode and the upper wiring, which is characterized by eliminating a via for connecting the upper wiring and the cell transistor at a time of manufacturing a hard copy. Accordingly, since a cell transistor and a routing switch part or a memory part are electrically disconnected, a parasitic capacitance is reduced, an operational speed of a chip is increased, and electric power consumption is reduced.

The following describes preferred exemplary embodiments of the present invention in detail with reference to the drawings.

First Exemplary Embodiment

First, description is given about a semiconductor device and a method of manufacturing the semiconductor device according to a first exemplary embodiment of the present invention. The first exemplary embodiment of the present invention first describes a semiconductor device on which a resistance variable element is mounted, and a method of manufacturing the semiconductor device, and describes how to form a hard copy.

A reconfigurable circuit to be hard copied in the present invention has a resistance variable element on a semiconductor substrate. The resistance variable element is a type of metal crosslink formation/depletion, and includes a wiring serving as a lower electrode provided with a copper wiring, the copper wiring having an opening part thereon, an ion conductive layer in contact with the opening part, and an upper electrode provided on an upper face of the ion conductive layer. Side and bottom faces of the copper wiring are surrounded by a barrier metal.

FIG. 1 is a sectional view schematically illustrating a configuration example of a semiconductor device according to the first exemplary embodiment of the present invention. A resistance variable element 1 is mounted inside a multi-layered wiring layer on a complementary metal oxide semiconductor (CMOS) substrate. A CMOS substrate base in formation of a reconfigurable circuit according to the exemplary embodiment of the present invention indicates layers below the resistance variable element 1.

The semiconductor device includes a silicon substrate 100 as an example of a semiconductor substrate, a MOSFET 99 formed on the silicon substrate 100, a multi-layered wiring structure formed on the silicon substrate 100 and the MOSFET 99, and the resistance variable element 1 assembled into the multi-layered wiring structure.

The multi-layered wiring structure in FIG. 1 includes a plurality of silicon oxide films 111 and 119, and SiOCH films 112 to 118 as insulating films stacked in a vertical direction. The multi-layered wiring structure in FIG. 1 further includes silicon carbonitride (SiCN) films 121 to 128 formed in between the plurality of silicon oxide films or the SiOCH films, and a silicon oxynitride film 120 as a protection film formed at an uppermost layer.

The multi-layered wiring structure in FIG. 1 further includes a tungsten plug 129 formed through the lowermost-layer silicon oxide film 111 in a thickness direction. The multi-layered wiring structure in FIG. 1 further includes a copper wiring 130 consisting of a Cu layer 134 and a barrier metal layer 133 and formed through the SiOCH film 112, which is a layer right above the lowermost layer, in a thickness direction. The multi-layered wiring structure in FIG. 1 further includes a copper wiring 130 consisting of a Cu layer 136 and a barrier metal layer 135 and formed in the SiOCH film 113, which is a layer upper than the copper wiring 130 consisting of the Cu layer 134 and the barrier metal layer 133. The multi-layered wiring structure in FIG. 1 further includes a dual damascene pattern formed in each of the SiOCH films 112 to 118, and an uppermost layer wiring formed across the silicon oxide film 119 and the uppermost-layer silicon oxynitride film 120.

The tungsten plug 129 consists of a tungsten layer 132, and a TiN layer 131 covering side and bottom faces of the tungsten layer 132. In each of the SiOCH film 112 to 118, a dual damascene groove is formed. The dual damascene pattern consists of Cu layers 140, 142, 144, and 146 each embedded in the dual damascene groove, and Ta/TaN films 139, 141, 143, and 145 each covering side and bottom faces of the Cu layers 140, 142, 144, and 146. The Ta/TaN films 139, 141, 143, and 145 are barrier metal films.

The uppermost layer wiring includes an Al—Cu layer 148 embedded in a groove-shaped via formed across the silicon oxide film 119 and the uppermost-layer silicon oxynitride film 120. The uppermost layer wiring further includes a Ti/TiN layer 147 as a barrier metal film covering side and bottom faces of the Al—Cu layer 148 within the silicon oxide film 119 and a boundary face between the silicon oxide film 119 and the silicon oxynitride film 120. The uppermost layer wiring further includes a Ti/TiN layer 149 as a barrier metal film covering a top face of the Al—Cu layer 148 within the silicon oxynitride film 120. The Ti/TiN layer 147 and the Ti/TiN layer 149 of the uppermost layer wiring can be omitted as needed. At the top face of the Al—Cu layer 148 constituting the uppermost layer wiring, a concave part for a connection pad is formed.

The uppermost layer wiring, the dual damascene patterns, the copper wirings 130, and the tungsten plug 129 are formed being aligned in a vertical direction, and the uppermost layer wiring, the tungsten plug 129, and the patterns are electrically connected with upper-layer and lower-layer wirings, plugs, or patterns.

Figure 2:
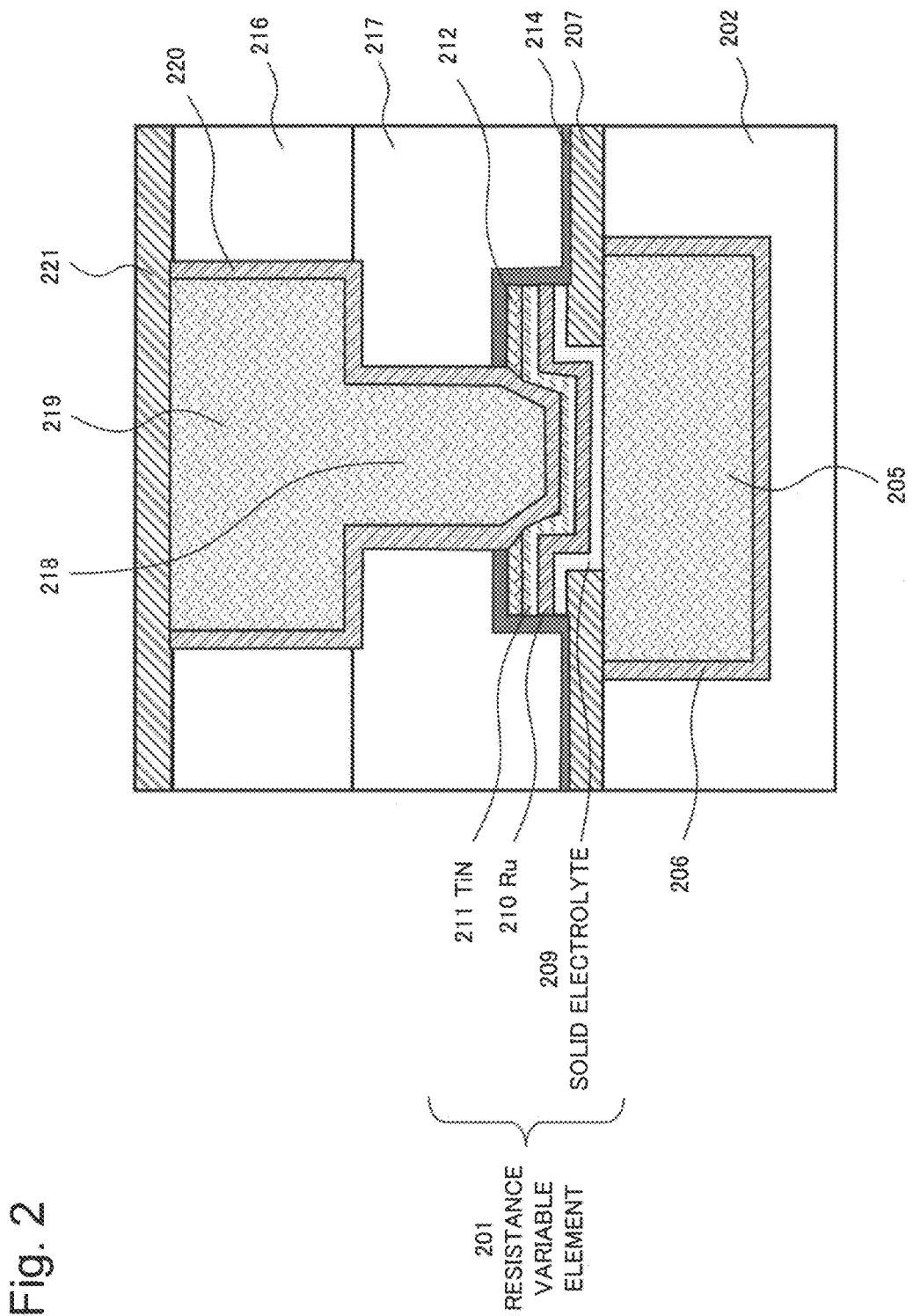
FIG. 2 is an enlarged view of a resistance variable element in FIG. 1 and a peripheral portion thereof.

FIG. 2 is an enlarged view of the resistance variable element 1 in FIG. 1 and a peripheral portion thereof, and illustrates a two-terminal switch. An opening part is provided to a SiCN film 207 as an example of a barrier insulating film, and a solid electrolyte film 209 as an example of an ion conductive layer is made of, for example, an oxide, and a material including, for example, carbon, oxygen, hydrogen, and silicon as main components. A resistance variable element 201 has a resistance state changed by precipitation of a metal ion in the solid electrolyte film 209. An upper electrode is an inactive electrode which does not react with copper, and is, for example, an electrode (Ru film 210) including ruthenium (Ru) as a main component. The upper electrode may further include thereabove a high-melting point nitrogen compound, such as a TiN film 211 as illustrated in FIG. 2, TaN, and the like. The upper electrode is connected with an upper wiring through a via plug 218, and may be a copper dual damascene wiring. The copper dual damascene wiring has side and bottom faces surrounded by a stacked barrier metal such as a Ta/TaN film 220, and has a top face surrounded by an insulating barrier film such as SiN and an SiCN film 221.

In FIG. 2, a multi-layered wiring layer has an insulation stack including an SiOCH film 202, an SiCN film 207, an SiN film 214, an SiO$_2$ film 217, an SiOCH film 216, and the SiCN film 221 which are sequentially stacked above a semiconductor substrate. In the multi-layered wiring layer, a wiring groove is formed in the SiOCH film 202. Side and bottom faces of the wiring groove are covered by a Ta/TaN film 206 as an example of a barrier metal film, and moreover, a Cu layer 205 as a first wiring is formed on the Ta/TaN film 206 so as to be embedded in the wiring groove. In FIG. 2, the first wiring is a lower wiring. In addition, a contact hole is formed in the SiN film 214 and an SiCN film 212. Further, a wiring groove is formed in the SiOCH film 216 and the SiO$_2$ film 217. Side and bottom faces of the contact hole and side and bottom faces the wiring groove are covered by the Ta/TaN film 220 as an example of a barrier metal film. The via plug 218 is in contact with the TiN film 211 of the resistance variable element 201 within the contact hole through the Ta/TaN film 220. The via plug 218 is formed so as to be embedded in the contact hole, and a Cu layer 219 as a second wiring is formed so as to be embedded in the wiring groove. In FIG. 2, the second wiring is an upper wiring. The Cu layer 219 and the via plug 218 are integrated as one body.

An opening in communication with the Cu layer 205 is formed in the SiCN film 207. The solid electrolyte film 209, the Ru film 210, and the TiN film 211 are sequentially stacked so as to cover a portion of the Cu layer 205 positioned within the opening, a side face of the opening of the SiCN film 207, and a part of a top face of the SiCN film 207. The resistance variable element 201 in FIG. 2 includes the solid electrolyte film 209, the Ru film 210, and the TiN film 211. The thus configured two-terminal switch in FIG. 2 is switched to an ON state or an OFF state and programmed by application of a voltage or an electric current.

Figure 3:
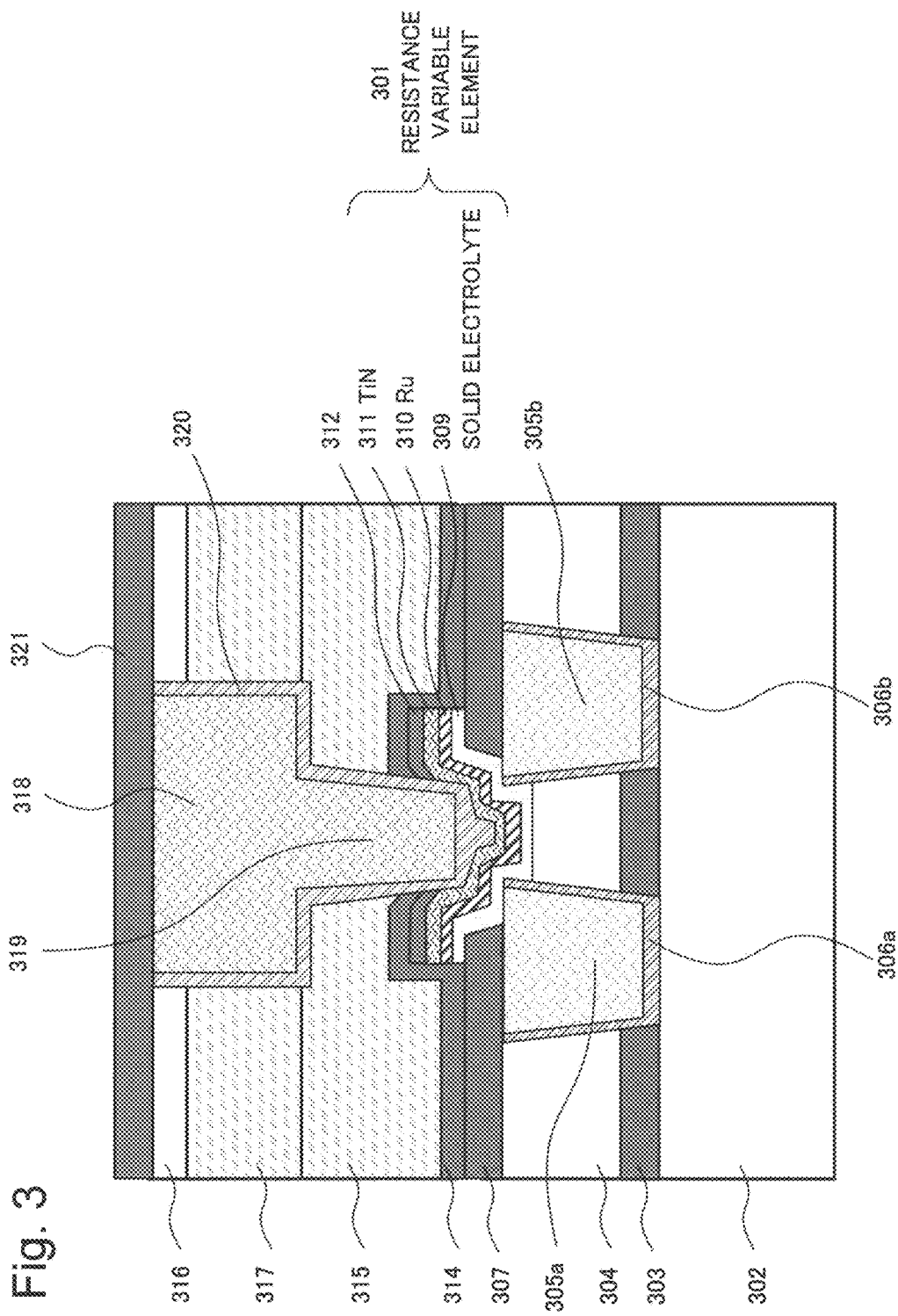
FIG. 3 is a modification example of the semiconductor device according to the first exemplary embodiment of the present invention.

FIG. 3 is a modification example of the semiconductor device according to the present exemplary embodiment, and illustrates a three-terminal switch. A structure is such that a resistance variable element is arranged facing in series and shares an upper electrode. By employing this structure, the semiconductor device is characterized in that stress voltage tolerance when a logic voltage is applied to the element can be improved in an insulation state (high-resistance state).

The semiconductor device in FIG. 3 has a multi-layered wiring layer including a pair of first wirings 305a and 305b, a via plug 319, and a resistance variable element 301. In FIG. 3, the pair of first wirings 305a and 305b are lower wirings. The pair of first wirings 305a and 305b also serve as lower electrodes of the three-terminal switch. The resistance variable element 301 is formed by sequentially stacking a solid electrolyte film 309, a Ru film 310, and a TiN film 311. The solid electrolyte film 309 is connected with the pair of first wirings 305a and 305b through a single opening of a SiCN film 307. The opening is formed so as to reach a part between an interlayer-insulating film 304 and each of the first wirings 305a and 305b.

The multi-layered wiring layer in FIG. 3 has an insulation stack including an interlayer-insulating film 302, a barrier insulating film 303, the interlayer-insulating film 304, the SiCN film 307, an SiN film 314, an SiO$_2$ film 315, an interlayer-insulating film 317, and an SiOCH film 316 which are sequentially stacked above a semiconductor substrate. In the multi-layered wiring layer, a pair of wiring grooves are formed in the interlayer-insulating film 304 and the barrier insulating film 303. Side and bottom faces of each of the wiring grooves are covered by barrier metal films 306a and 306b, and further, the pair of first wirings 305a and 305b are formed so as to be embedded in the pair of wiring grooves.

In addition, a contact hole is formed in the SiO$_2$ film 315, the SiN film 314, and a hard mask film 312. Further, a wiring groove is formed in the interlayer-insulating film 317 and the SiOCH film 316. Side and bottom faces of the contact hole and side and bottom faces of the wiring groove are covered by a barrier metal film 320. The via plug 319 is formed so as to be embedded in the contact hole, and a second wiring 318 is formed so as to be embedded in the wiring groove. The via plug 319 is in contact with the TiN film 311 of the resistance variable element 301 through the barrier metal film 320. The second wiring 318 and the via plug 319 are integrated as one body. In FIG. 3, the second wiring is an upper wiring.

An opening in communication with the first wirings 305a and 305b is formed in the SiCN film 307. The solid electrolyte film 309, the Ru film 310, and the TiN film 311 are sequentially stacked so as to cover portions of the first wirings 305a and 305b positioned within the opening, a side face of the opening of the SiCN film 307, and a part of a top face of the SiCN film 307. The thus configured three-terminal switch is switched to an ON state or an OFF state and programmed by application of a voltage or an electric current.

Figure 4:
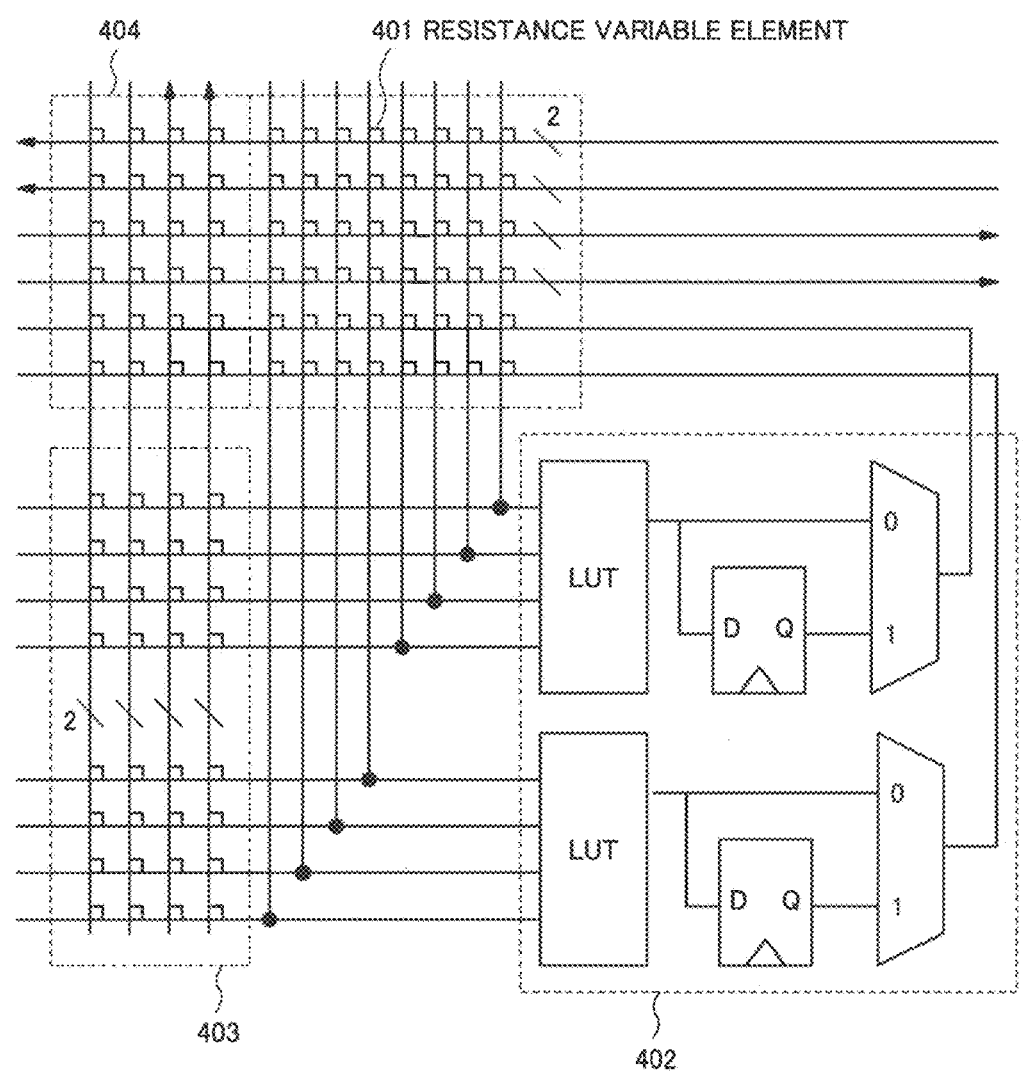
FIG. 4 is a schematic diagram of a reconfigurable logic cell when a resistance variable element is used.

FIG. 4 is a schematic diagram of a reconfigurable logic cell when a resistance variable element is used. An example of the reconfigurable logic cell to which the semiconductor device and the resistance variable element illustrated in FIGS. 1 and 2 are applied is illustrated. The reconfigurable logic cell in FIG. 4 includes a logic block 402, a connection block 403 including crossbars, and a switch block 404 including crossbars. At each intersection of the crossbars in the connection block 403 and the switch block 404, a programmable resistance variable element 401 is arranged.

In FIG. 4, the logic block 402 includes two four-input one-output look-up-tables (LUTs). Further, the logic block 402 includes a flip-flop (D-FF) which inputs an output from the LUT, and a multiplexer (MUX) which selects and outputs either one of an output from the LUT or an output from the flip-flop. The look-up-table includes, for example, a multiplexer (MUX) configured by arranging pass transistors in a tree shape, and an SRAM connected to an end of the tree. In accordance with a value given as an input to the multiplexer, an output from the single SRAM is output from the multiplexer.

Figure 5:
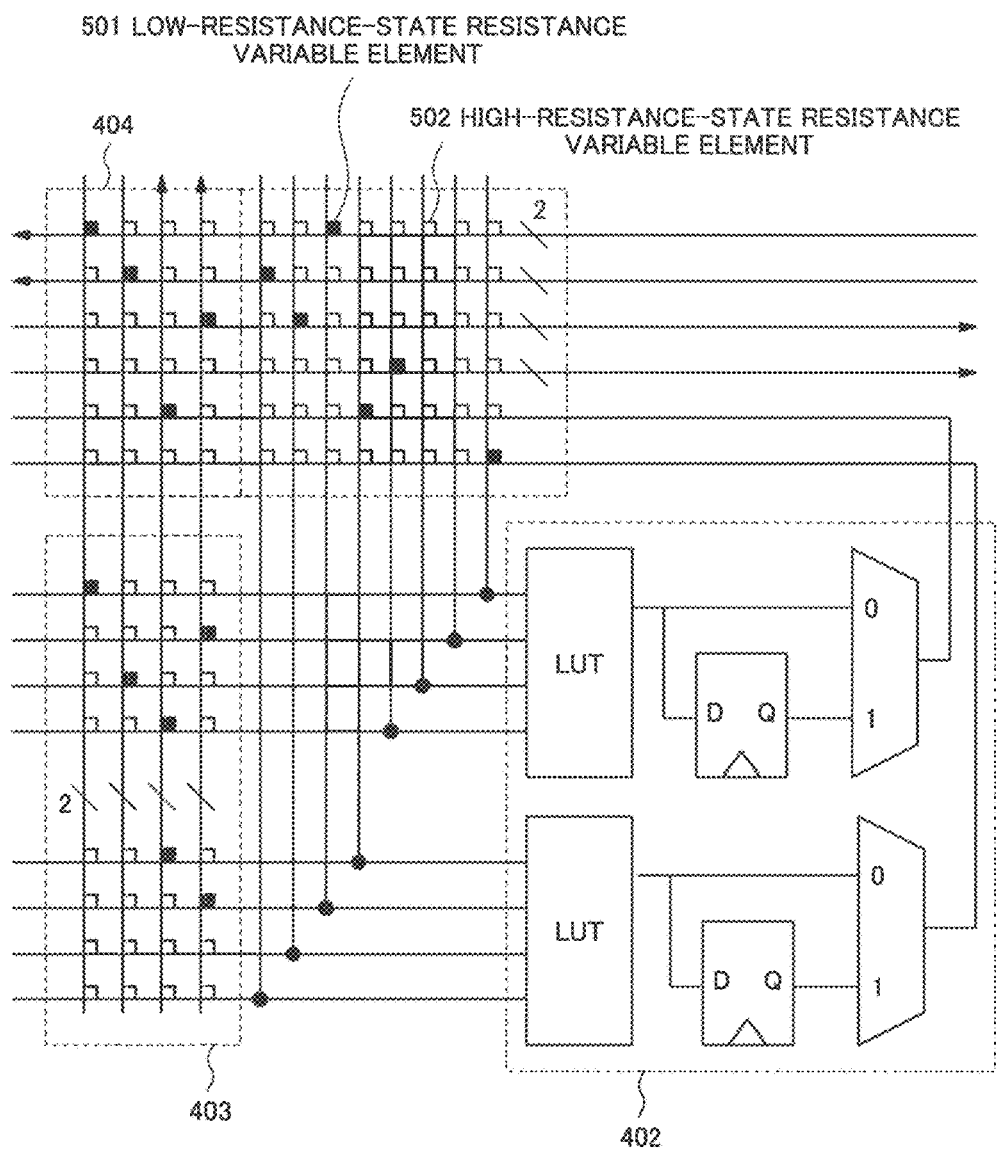
FIG. 5 is a schematic diagram illustrating an example of a programming state of a resistance variable element when a certain operation function is mapped on the reconfigurable logic cell.

FIG. 5 is a schematic diagram illustrating an example of a programming state of a resistance variable element when a certain operation function is mapped on the reconfigurable logic cell in FIG. 4. The resistance variable element 401 within crossbar blocks of the switch block 404 and the connection block 403 is programmed in order to achieve a desired logic function. The resistance variable element in FIG. 4 is programmed to either a low-resistance-state resistance variable element 501 or a high-resistance-state resistance variable element 502, as illustrated in FIG. 5.

It is possible to lay a plurality of reconfigurable logic cells in FIG. 4 in a shape of tiles, although depending on a scale of a circuit desired to be achieved.

In FIG. 4, an example in which two LUTs are included is described. However, four, six, and eight LUTs may be included, without limitation to two.

In FIG. 5, an example in which a resistance variable element to be programmed is positioned at a crossbar. However, the resistance variable element may be used for potential fixing to a power supply and a ground.

Next, the following specifically describes a semiconductor device and a method of manufacturing the semiconductor device, and a method of manufacturing a hard copy according to the present exemplary embodiment of the present invention.

Figure 6A:
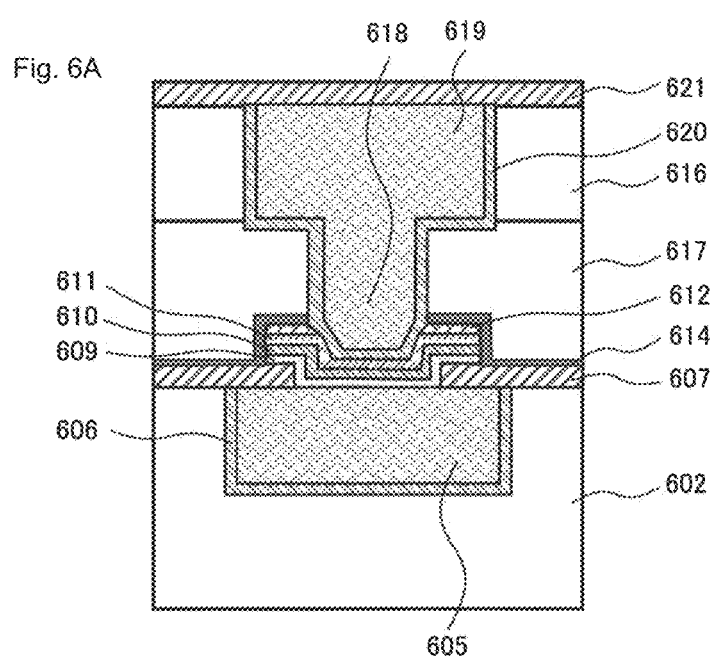
FIG. 6A is a sectional view illustrating a configuration of a resistance variable element in a reconfigurable circuit.
Figure 6B:
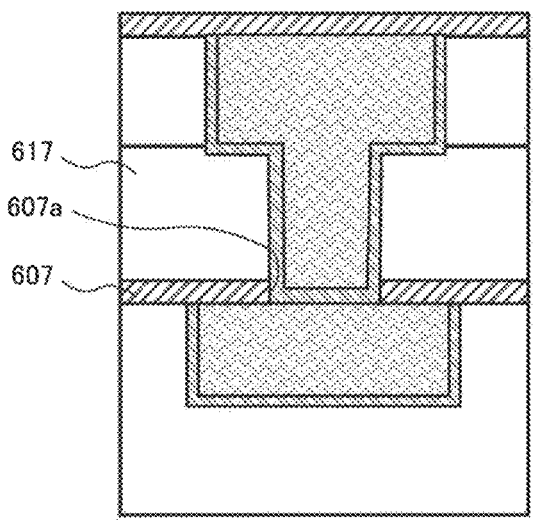
FIG. 6B and FIG. 6C are sectional views each illustrating a configuration of an original resistance variable element part at a time of manufacturing a hard copy.
Figure 6C:
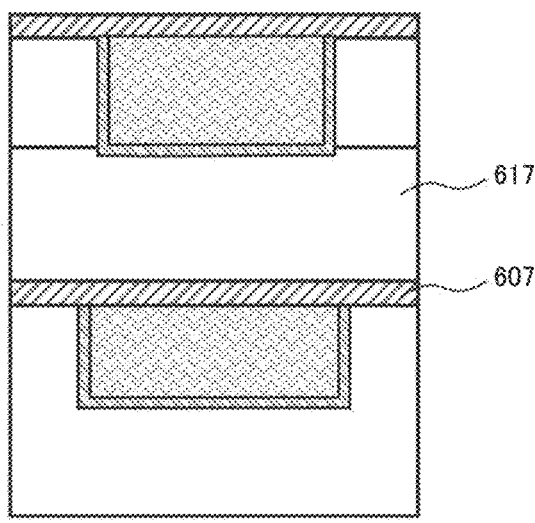

FIG. 6(A) is a sectional view illustrating a configuration of a resistance variable element in a reconfigurable circuit, and FIGS. 6(B) and 6(C) are sectional views each illustrating a configuration of an original resistance variable element part at a time of manufacturing a hard copy. In the reconfigurable circuit, a low-resistance state (short circuit state) and a high-resistance state (insulation state) are formed by programming the resistance variable element.

The resistance variable element in the reconfigurable circuit in FIG. 6(A) includes the resistance variable element similar to that in FIG. 2. In FIG. 6(A), a multi-layered wiring layer has an insulation stack including an SiOCH film 602, an SiCN film 607 as an example of an insulating barrier film, an SiN film 614, an SiO$_2$ film 617, an SiOCH film 616, and an SiCN film 621 which are sequentially stacked above a semiconductor substrate. In the multi-layered wiring layer, a wiring groove is formed in the SiOCH film 602. Side and bottom faces of the wiring groove are covered by a Ta/TaN film 606 as an example of a barrier metal film, and further, a Cu layer 605 as a first wiring is formed on the Ta/TaN film 606 so as to be embedded in the wiring groove. In FIG. 6(A), the first wiring is a lower wiring. In addition, a contact hole is formed in the SiN film 614 and an SiCN film 612, and further, a wiring groove is formed in the SiOCH film 616 and the SiO$_2$ film 617. Side and bottom faces of the contact hole and side and bottom faces of the wiring groove is covered by a Ta/TaN film 620 as an example of a barrier metal film. A via plug 618 is formed so as to be embedded in the contact hole, and a Cu layer 619 as a second wiring is formed so as to be embedded in the wiring groove. In FIG. 6(A), the second wiring is an upper wiring. The Cu layer 619 and the via plug 618 are integrated as one body.

An opening in communication with the Cu layer 605 is formed in the SiCN film 607. A solid electrolyte film 609, a Ru film 610, and a TiN film 611 are sequentially stacked so as to cover a portion of the Cu layer 605 positioned within the opening, a side face of the opening of the SiCN film 607, and a part of a top face of the SiCN film 607. The resistance variable element includes the solid electrolyte film 609, the Ru film 610, and the TiN film 611.

In the present exemplary embodiment regarding the above, a mask for forming the via plug 618 connected with an upper electrode (the Ru film 610 and the TiN film 611) of the resistance variable element is changed at a time of manufacturing a hard copy of a reconfigurable circuit including the resistance variable element. Further, in the present exemplary embodiment, a process of manufacturing a resistance variable element is eliminated.

Taking an example of the switch block 404 and the connection block 403 in FIG. 5 to describe this, the resistance variable element present within the crossbar blocks is not formed at a time of manufacturing a hard copy according to the present exemplary embodiment. Since the resistance variable element is not formed, a mask is changed in such a manner that the opening illustrated in FIG. 6(A), which is for the solid electrolyte film 609 of the resistance variable element to communicate with the Cu layer 605, is not formed in the SiCN film 607, neither.

More specifically, a mask is changed in such a manner that the via plug 618 illustrated in FIG. 6(A) is not formed at a portion where the upper and lower wirings is electrically disconnected (insulation state), such as a portion where the high-resistance-state resistance variable element 502 in FIG. 5 is arranged. Manufacturing with use of the thus changed mask results in a structure illustrated in FIG. 6(C). The upper and lower wirings are insulated by the SiO$_2$ film 617 and the SiCN film 607 being interposed therebetween.

A mask for forming the via plug 618 also forms the opening of the SiCN film 607 at a portion where the upper and lower wirings are connected by the via plug 618 (short circuit state), such as a portion where the low-resistance-state resistance variable element 501 in FIG. 5 is arranged. Manufacturing in this manner results in a structure illustrated in FIG. 6(B). The upper and lower wirings are connected through the via plug 618.

In this manner, a portion where upper and lower wirings are connected by a via plug (short circuit state) and a portion where upper and lower wirings are electrically disconnected (insulation state) can be created separately in a manufacture process. Thus, the present exemplary embodiment enables fabrication of a hard copy of a reconfigurable circuit including a resistance variable element.

Resistance states to be created separately are correspondable by reflecting positions mapped in a reconfigurable circuit as illustrated in FIG. 5 to a mask layout. For example, positions are reflected and corresponded in such a manner that upper and lower wirings are connected by a via plug at a portion where the low-resistance-state resistance variable element 501 in FIG. 5 is positioned, and that upper and lower wirings are electrically disconnected at a portion where the high-resistance-state resistance variable element 502 is positioned. Using a CMOS substrate same as that of a reconfigurable circuit when manufacturing a hard copy thereof makes it possible to manufacture the hard copy merely by changing a single mask for fabricating a via plug.

EXAMPLES

Example 1

Figure 7A:
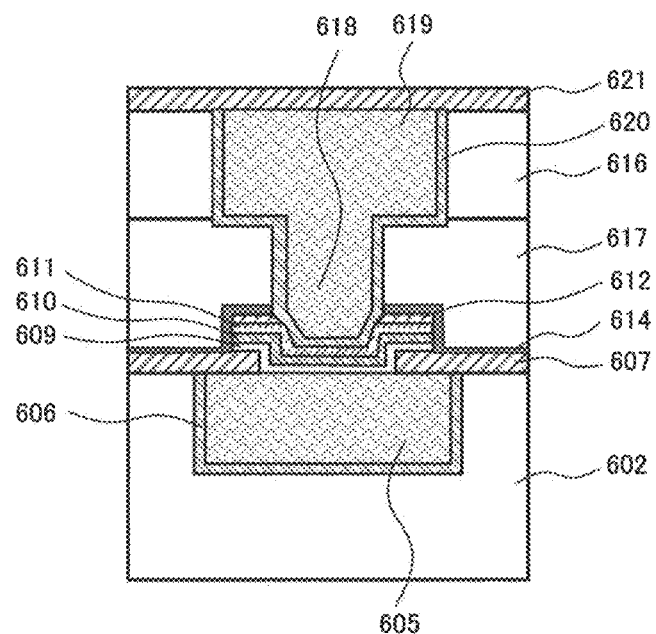
FIG. 7A is a sectional view illustrating a configuration of a resistance variable element in a reconfigurable circuit.
Figure 7B:
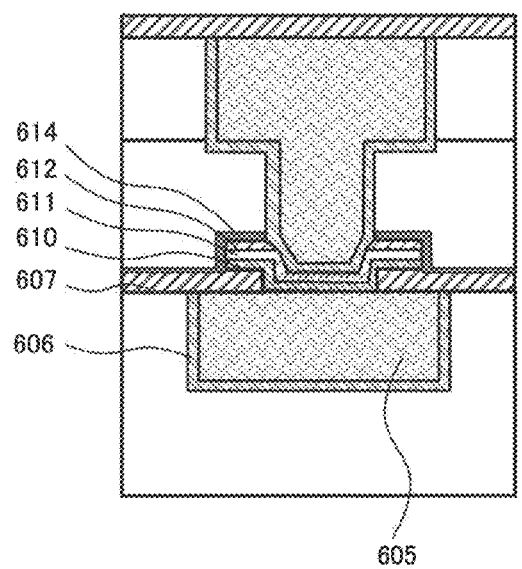
FIG. 7B and FIG. 7C are sectional views each illustrating a configuration of an original resistance variable element part at a time of manufacturing a hard copy.
Figure 7C:
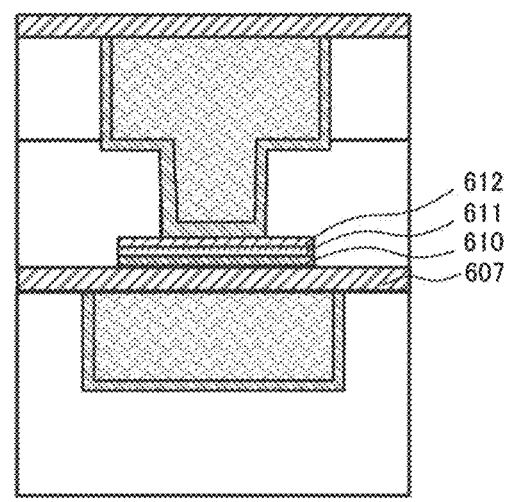

Next, description is given of a modification example relating to a method of manufacturing a hard copy, as an example 1 of the first exemplary embodiment. FIG. 7(A) is a sectional view illustrating a configuration of a resistance variable element in a reconfigurable circuit, and FIGS. 7(B) and 7(C) are sectional views each illustrating a configuration of an original resistance variable element part at a time of manufacturing a hard copy. FIG. 7(A) illustrates a resistance variable element having the same configuration as the resistance variable element in the reconfigurable circuit in FIG. 6(A). The same reference numerals are assigned to the same components, and description therefor is omitted.

In the present example, a mask for an opening part to be formed in an insulating barrier film positioned above a copper wiring is changed and a solid electrolyte layer is eliminated from a resistance variable element, at a time of manufacturing a hard copy of a reconfigurable circuit including the resistance variable element.

At a portion where the upper and lower wirings are electrically disconnected (insulation state), a mask is changed in such a manner that the opening part is not formed in the SiCN film 607 positioned above the Cu layer 605 illustrated in FIG. 7(A). Further, the solid electrolyte film 609 of the resistance variable element is not formed. Manufacturing with use of the thus changed mask results in a structure illustrated in FIG. 7(C). FIG. 7(C) indicates a state in which the SiN film 614 in FIG. 7(A) is not formed, either. The upper and lower wirings are insulated by the SiCN film 607 or the like being interposed therebetween.

At a portion where the upper and lower wirings are connected by the via plug 618 (short circuit state), the opening part of the SiCN film 607 illustrated in FIG. 7(A) is formed and the solid electrolyte film 609 of the resistance variable element is not formed. This results in a structure illustrated in FIG. 7(B), in which the upper and lower wirings are electrically connected through the via plug 618 and electrode films such as the Ru film 610 and the TiN film 611. Since the contact hole is formed in the $SiO_2$ film 617, the SiN film 614, and the SiCN film 612 in this structure in the same manner as FIG. 7(A), the via plug 618 is in contact with the TiN film 611 through the Ta/TaN film 620.

Thus, in the present example, a mask for an opening part to be formed in an insulating barrier film positioned on a copper wiring is changed, a solid electrolyte is eliminated from a resistance variable element, and a device is formed by a process for electrodes only. This makes it possible to separately create a short circuit state and an insulation state in a manufacture process, at a time of manufacturing a hard copy of a reconfigurable circuit including a resistance variable element. Further, according to the present example, a short circuit state and an insulation state can be separately created by using a structure different from that of the hard copy illustrated in FIGS. 6(B) and 6(C). An advantage of the structure according to the present example is that a hard copy can be created with less change from a process of manufacturing a reconfigurable circuit using a resistance variable element.

Example 2

Figure 8A:
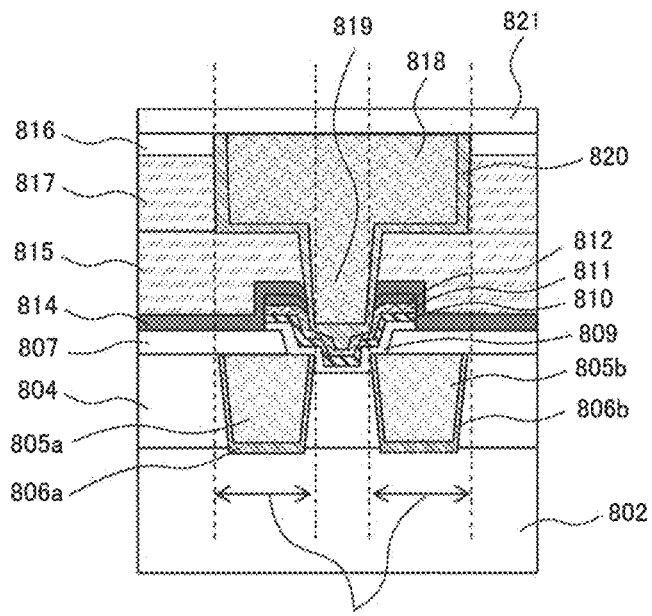
FIG. 8A is a sectional view illustrating a configuration of a resistance variable element in a reconfigurable circuit.
Figure 8B:
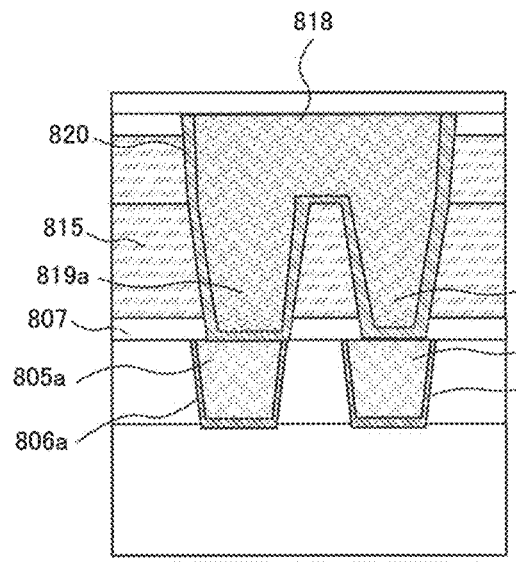
FIG. 8B and FIG. 8C are sectional views each illustrating a configuration of an original resistance variable element part at a time of manufacturing a hard copy.
Figure 8C:
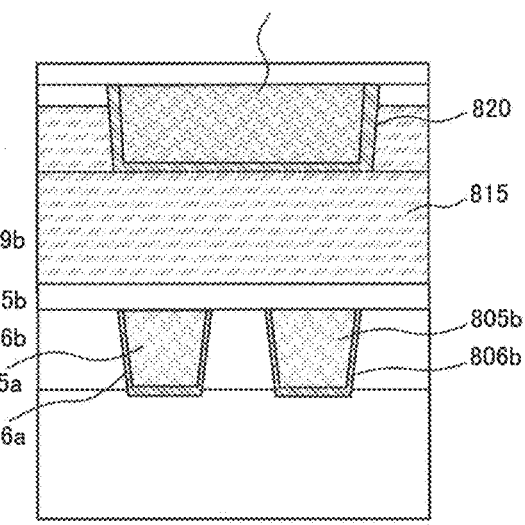

Next, description is given of another modification example relating to a method of manufacturing a hard copy, as an example 2 of the first exemplary embodiment. FIG. 8(A) is a sectional view illustrating a configuration of a resistance variable element in a reconfigurable circuit, and FIGS. 8(B) and 8(C) are sectional views each illustrating a configuration of an original resistance variable element part at a time of manufacturing a hard copy. A semiconductor device in FIG. 8(A) includes a resistance variable element similar to that in FIG. 3.

A multi-layered wiring layer includes a pair of first wirings 805a and 805b, a via plug 819, and the resistance variable element. In FIG. 8(A), the pair of first wirings 805a and 805b are lower wirings. The pair of first wirings 805a and 805b also serve as lower electrodes of a three-terminal switch. The resistance variable element is formed by sequentially stacking a solid electrolyte film 809, a Ru film 810, and a TiN film 811. The solid electrolyte film 809 is connected with the pair of first wirings 805a and 805b through a single opening of an SiCN film 807. The opening is formed so as to reach a part between an interlayer-insulating film 804 and each of the first wirings 805a and 805b.

The multi-layered wiring layer in FIG. 8(A) has an insulation stack including an interlayer-insulating film 802, the interlayer-insulating film 804, the SiCN film 807, an SiN film 814, an interlayer-insulating film 815, an interlayer-insulating film 817, and an SiOCH film 816 which are sequentially stacked above a semiconductor substrate. In the multi-layered wiring layer, a pair of wiring grooves are formed in the interlayer-insulating film 804. Side and bottom faces of the wiring grooves are respectively covered by barrier metal films 806a and 806b, and further, the pair of first wirings 805a and 805b are formed so as to be embedded in the pair of wiring grooves.

In addition, a contact hole is formed in the SiOCH film 816, the interlayer-insulating film 817, the interlayer-insulating film 815, the SiN film 814, and a hard mask film 812, and further, a wiring groove is formed in the interlayer-insulating film 817 and the SiOCH film 816. Side and bottom faces of the contact hole and side and bottom faces of the wiring groove are covered by a barrier metal film 820. The via plug 819 is formed so as to be embedded in the contact hole, and a second wiring 818 is formed so as to be embedded in the wiring groove. The second wiring 818 and the via plug 819 are integrated as one body. In FIG. 8(A), the second wiring 818 is an upper wiring.

An opening in communication with the first wirings 805a and 805b is formed in the SiCN film 807. The solid electrolyte film 809, the Ru film 810, and the TiN film 811 are sequentially stacked so as to cover portions of the first wirings 805a and 805b positioned within the opening, a side face of the opening of the SiCN film 807, and a part of a top face of the SiCN film 807.

In the present example, the resistance variable element includes wirings also serving as lower electrodes 805a and 805b, a resistance variable layer, and an upper electrode. The resistance variable layer is connected with the wirings also serving as lower electrodes 805a and 805b through the opening part of the insulating barrier film 807 provided on the wirings also serving as lower electrodes 805a and 805b. The upper electrode is connected with the upper wiring 818 through the via plug 819. Further, the present example is characterized by having such an arrangement that the wirings also serving as lower electrodes 805a and 805b and the upper wiring 818 overlap each other in a direction vertical to the substrate in such a manner that a via plug can be formed in advance.

As illustrated by dotted lines in FIG. 8(A), the upper wiring 818 and the wiring also serving as a lower electrode 805a are arranged with visible outlines thereof overlapping in a substantially vertical direction, and the upper wiring 818 and the wiring also serving as a lower electrode 805b are arranged with visible outlines thereof overlapping in a substantially vertical direction.

In the present example, at a time of manufacturing a hard copy of a reconfigurable circuit including a resistance variable element, a process of manufacturing the resistance variable element is eliminated, and a mask for forming a via plug for connecting an upper electrode of the resistance variable element and an upper wiring is changed. Accordingly, a short circuit state and an insulation state are separately created in a manufacture process.

For example, in the present example, the resistance variable element present within crossbar blocks of the switch block 404 and the connection block 403 in FIG. 5 is not formed at a time of manufacturing a hard copy. Since the resistance variable element is not formed, a mask is changed in such a manner that the opening part illustrated in FIG. 8(A), which is for the solid electrolyte film 809 of the resistance variable element to communicate with the pair of wirings also serving as lower electrodes 805a and 805b, is not formed in the insulating barrier film 807.

At a portion where the upper and lower wirings are electrically disconnected (insulation state), a mask is changed in such a manner that the via plug 819 illustrated in FIG. 8(A) is not formed. Manufacturing with use of the thus changed mask results in a structure illustrated in FIG. 8(C). The upper and lower wirings are insulated by the interlayer-insulating film 815 and the SiCN film 807.

At a portion where the upper and lower wirings are connected by the via plug (short circuit state), a mask is changed in such a manner that via plugs 819a and 819b, rather than the via plug 819 illustrated in FIG. 8(A), are formed at a position where the upper wiring 818 and the wirings also serving as lower electrodes 805a and 805b overlap each other in a vertical direction. Manufacturing with use of the thus changed mask results in a structure illustrated in FIG. 8(B). The mask for forming the via plugs 819a and 819b also forms the two openings of the SiCN film 807. The upper wiring 818 is connected with the wiring also serving as a lower electrode 805a through the via plug 819a, and the upper wiring 818 is connected with the wiring also serving as a lower electrode 805b through the via plug 819b. Accordingly, a portion where the upper and lower wirings are connected by a via plug (short circuit state) and a portion where the upper and lower wirings are electrically disconnected (insulation state) are separately created in a manufacture process. In this manner, a hard copy of a reconfigurable circuit including a resistance variable element can be manufactured.

An advantage of the method according to the present example is that, in laying out a reconfigurable chip on which a resistance variable element is mounted in advance, it is attempted to have such an arrangement that upper and lower wirings overlap each other in a direction vertical to a substrate, in consideration of a connection position of a via plug at a time of manufacturing a hard copy. This makes it possible to separately create both a reconfigurable circuit chip and a hard copy with use of the same CMOS substrate merely by changing a single mask for forming a via plug.

Second Exemplary Embodiment

Next, description is given of a semiconductor device, and a method of manufacturing the semiconductor device according to a second exemplary embodiment of the present invention. The present exemplary embodiment describes a method whereby, when a hard copy is formed from a semiconductor device on which a resistance variable element is mounted, an operational speed and electric power consumption of a chip are further improved by eliminating a via plug for connecting a cell transistor and the resistance variable element.

Figure 9:
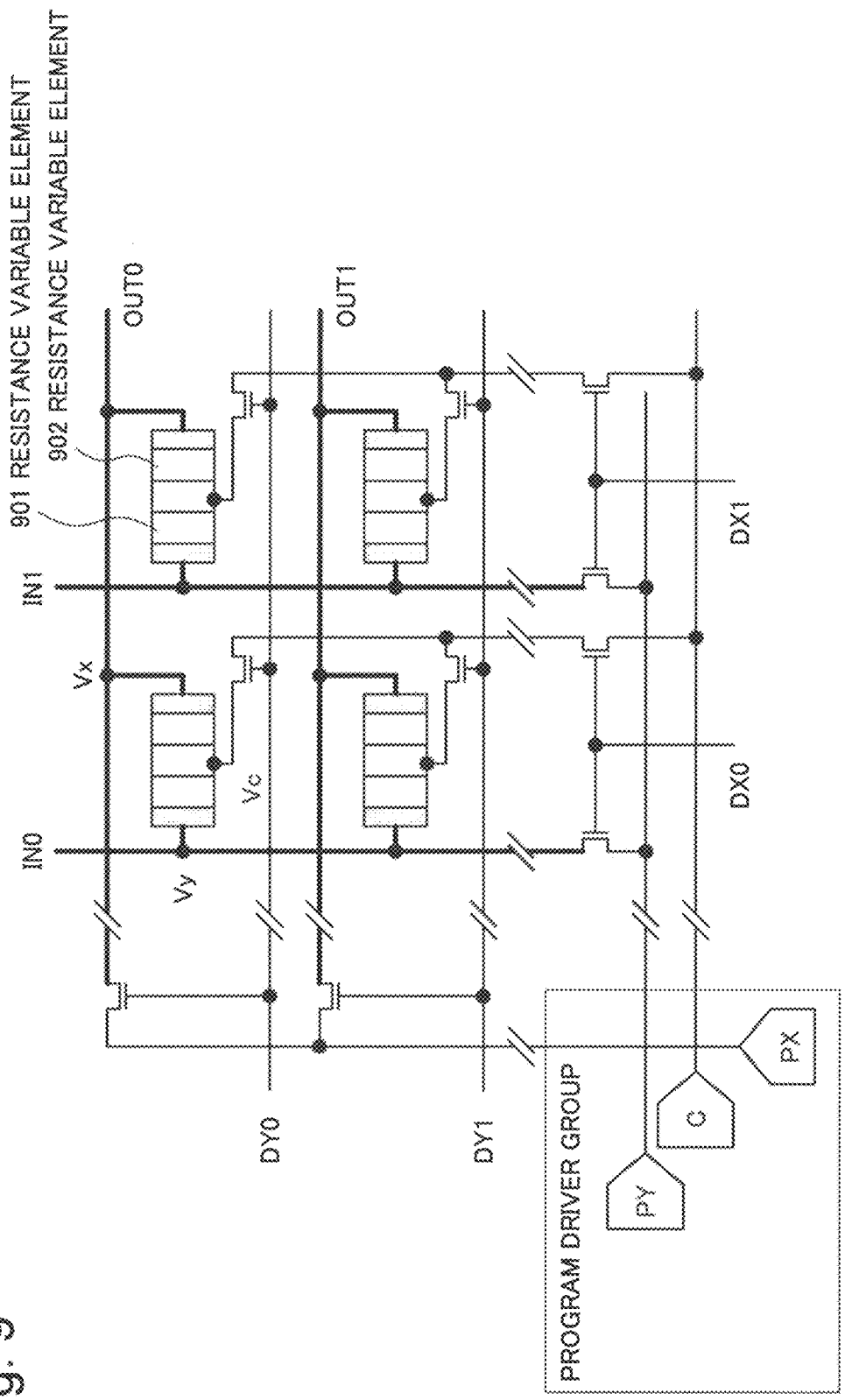
FIG. 9 is an application example of a crossbar switch in a reconfigurable circuit using a resistance variable element.

FIG. 9 is an application example of a crossbar switch in a reconfigurable circuit using a resistance variable element. In this case, two bipolar resistance-variable-type elements 901 and 902 are connected in series facing each other, and a cell transistor (programmable transistor) is arranged at an intermediate node. By programming a resistance state of the resistance variable element in accordance with an operation function to be implemented, a destination of propagation of a signal by the crossbar switch can be arbitrarily changed.

Figure 10:
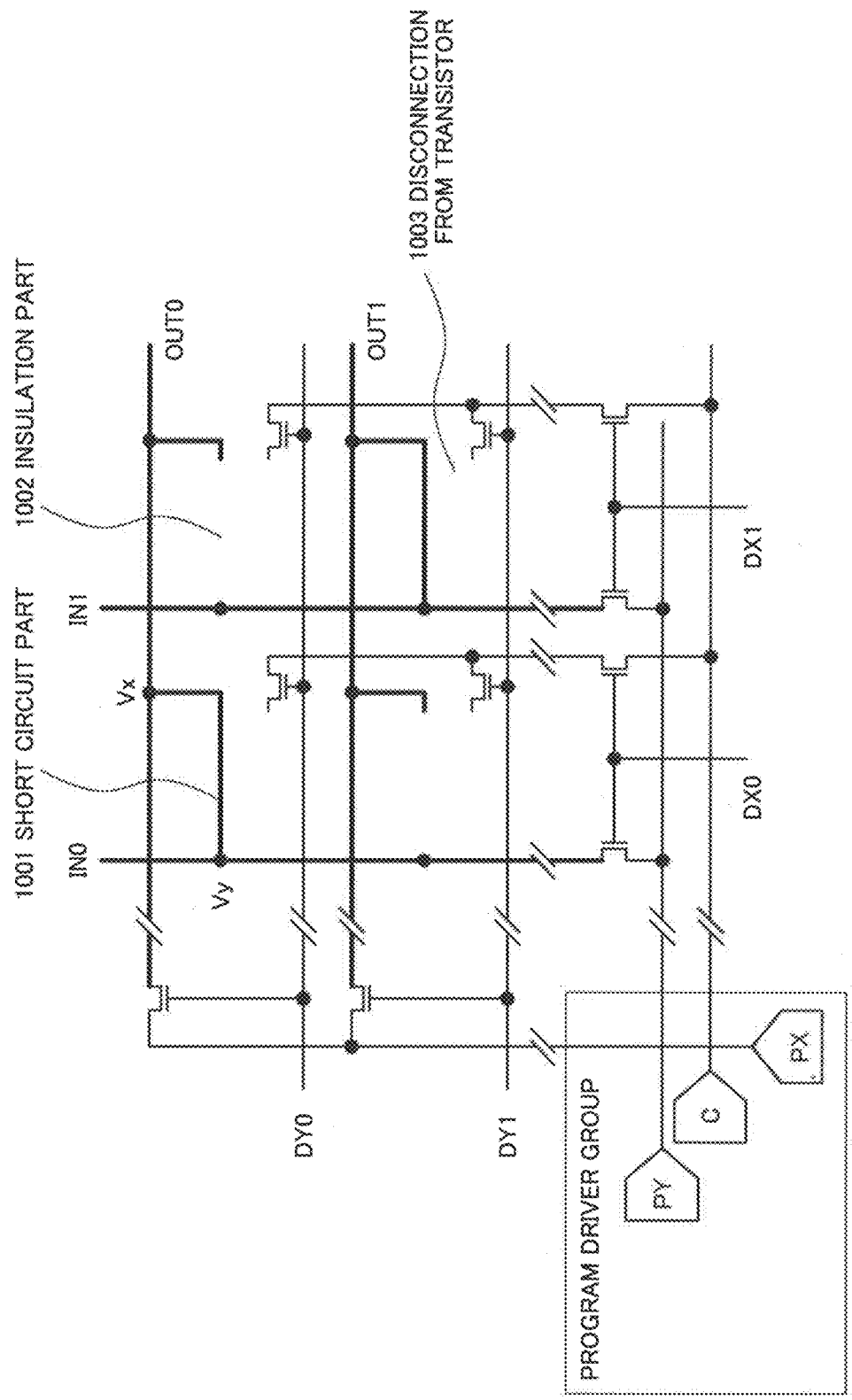
FIG. 10 is a circuit diagram when a hard copy is manufactured from the reconfigurable circuit illustrated in FIG. 9 by using a method according to the present invention.

FIG. 10 is a circuit diagram when a hard copy is manufactured from the reconfigurable circuit illustrated in FIG. 9 by using a method according to the present exemplary embodiment.

When both the resistance variable element 901 and the resistance variable element 902 in the reconfigurable circuit illustrated in FIG. 9 are programmed to a low-resistance state, a state similar to a short circuit part 1001 in FIG. 10 is obtained. When the resistance variable element 901 or the resistance variable element 902 in the reconfigurable circuit illustrated in FIG. 9 is programmed to a high-resistance state, a state similar to an insulation part 1002 in FIG. 10 is obtained. When the cell transistor (programmable transistor) in the reconfigurable circuit illustrated in FIG. 9 is turned to an OFF state, a state similar to a transistor-disconnected part 1003 is obtained.

Figure 11A:
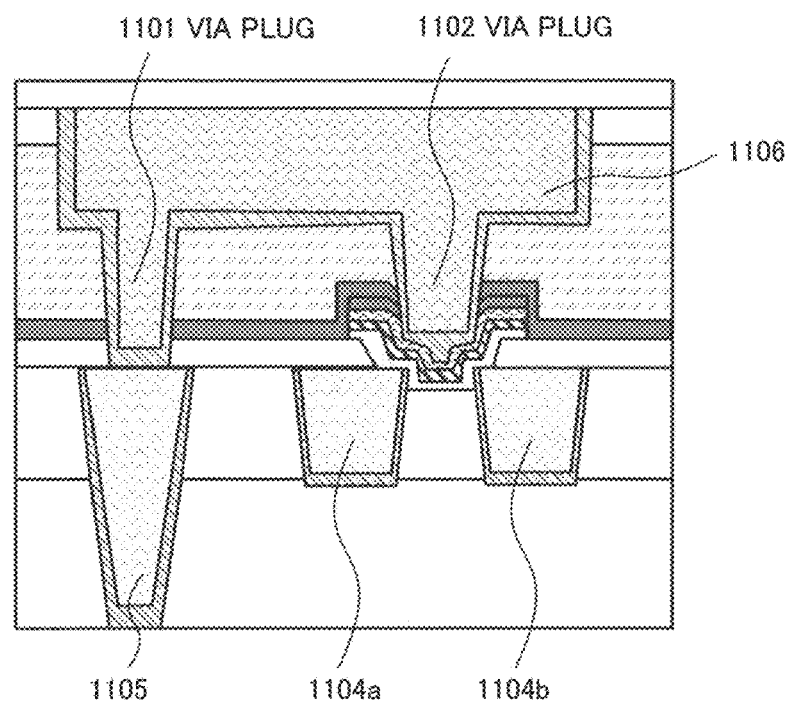
FIG. 11A is a schematic diagram illustrating a cross section of an element in a reconfigurable circuit according to a second exemplary embodiment of the present invention.
Figure 11B:
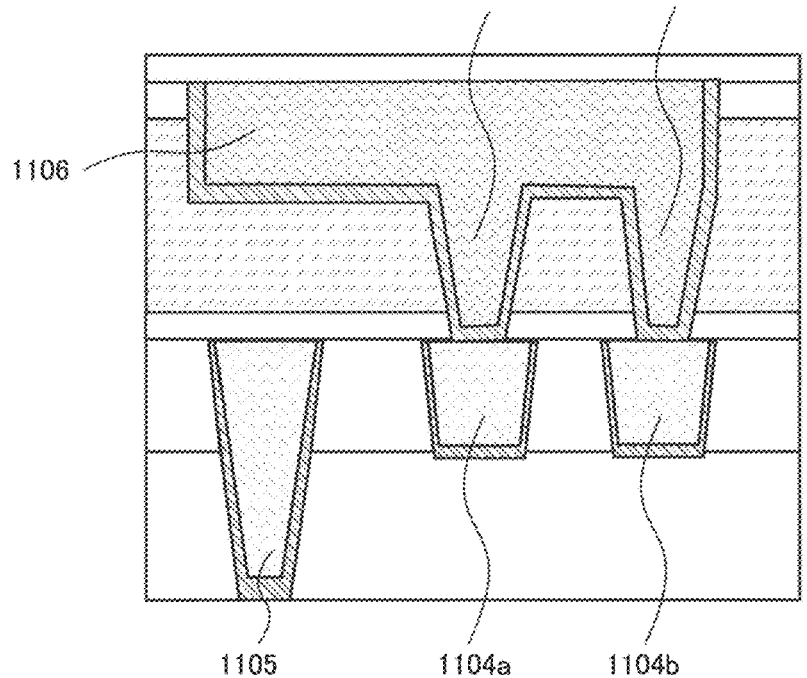
FIG. 11B is a schematic diagram illustrating a cross section of an element in a reconfigurable circuit at the portion at a time of manufacturing a hard copy.

FIG. 11(A) is a schematic diagram illustrating a cross section of an element in a reconfigurable circuit according to the second exemplary embodiment of the present invention, and FIG. 11(B) is a schematic diagram illustrating a cross section of an element in a reconfigurable circuit at the portion at a time of manufacturing a hard copy. In FIG. 11(A), a multi-layered wiring layer includes a pair of first wirings 1104a and 1104b, a via plug 1102, and a resistance variable element, similarly to the semiconductor device in FIG. 8(A). In FIG. 11(A), the pair of first wirings 1104a and 1104b are lower wirings. The pair of first wirings 1104a and 1104b also serve as lower electrodes of a three-terminal switch. Further, similarly to the semiconductor device in FIG. 8(A), a contact hole is formed in an interlayer-insulating film, an SiN film, and a hard mask film, and the via plug 1102 is in contact with an upper electrode of the resistance variable element through a barrier metal film. The via plug 1102 is formed so as to be embedded in the contact hole, and a second wiring 1106 is formed so as to be embedded in the wiring groove. The second wiring 1106 and the via plug 1102 are integrated as one body. In FIG. 11(A), the second wiring 1106 is an upper wiring.

In the reconfigurable circuit using a resistance variable element according to the present exemplary embodiment, the upper electrode to be an intermediate node is once drawn up to the upper-layer wiring through the via plug 1102. A leading end thereof is connected to the lower-layer wiring through a via plug 1101, and further, is connected with a not illustrated cell transistor (programmable transistor). In other words, in FIG. 11(A), the upper wiring is connected with one end of a via plug 1105 formed in the lower-layer interlayer-insulating film, through the via plug 1101 provided at a part different from the via plug 1102. Another end of the via plug 1105 is connected with the not illustrated cell transistor (programmable transistor). Such a configuration achieves a circuit configuration in which the two bipolar resistance-variable-type elements 901 and 902 illustrated in FIG. 9 are connected in series facing each other, and a cell transistor (programmable transistor) is connected with an intermediate node.

The semiconductor device according to the present exemplary embodiment has such an arrangement that the first wirings 1104a and 1104b as the wirings also serving as lower electrodes and the second wiring 1106 as the upper wiring overlap each other in a direction vertical to a substrate in such a manner that a via plug can be formed therebetween in advance, in the same manner as the semiconductor device illustrated in FIG. 8(A).

Next, description is given specifically of fabrication of a hard copy of such a reconfigurable circuit including a resistance variable element. In the present exemplary embodiment, at a time of manufacturing a hard copy of a reconfigurable circuit including a resistance variable element, a process of manufacturing the resistance variable element is eliminated, and a mask for the via plug 1102 connecting to the upper electrode of the resistance variable element is changed. Accordingly, a short circuit state and an insulation state are separately created in a manufacture process.

In the present exemplary embodiment, the resistance variable elements 901 and 902 illustrated in FIG. 9 are not formed at a time of manufacturing a hard copy. Since the resistance variable elements are not formed, a mask is changed in such a manner that the opening part illustrated in FIG. 11(A), which is for the resistance variable elements to communicate with the pair of first wirings 1104a and 1104b, is not formed in the insulating barrier film.

The insulation part 1002 in FIG. 10 can be implemented by changing a mask in such a manner that the via plug 1102 illustrated in FIG. 11(A) is not formed (not illustrated). Manufacturing with use of the thus changed mask results in a structure as illustrated in FIG. 8(C). The pair of first wirings 1104a and 1104b are not connected with each other, and the insulation part 1002 in FIG. 10 is implemented.

The short circuit part 1001 in FIG. 10 can be implemented by changing a mask in such a manner that the via plug 1102 illustrated in FIG. 11(A) is not formed, and that via plugs 1103a and 1103b are formed at a position where the second wiring 1106 and the first wirings 1104a and 1104b overlap each other in a vertical direction. In order to achieve, in particular, a short circuit state by eliminating both the via plug 1101 connecting to a transistor and the via plug 1102 connecting to the upper electrode of the resistance variable element, a mask is changed in such a manner that the via plugs 1103a and 1103b are formed. Manufacturing with use of the thus changed mask results in a structure as illustrated in FIG. 11(B) on the right side of the figure. The mask for forming the via plugs 1103a and 1103b also forms the two openings of the insulating barrier film. The second wiring 1106 is connected with the first wiring 1104a through the via plug 1103a, and the second wiring 1106 is connected with the first wiring 1104b through the via plug 1103b. The first wiring 1104a and the first wiring 1104b are thus connected with each other via the second wiring 1106 as the upper wiring, and the short circuit part 1001 in FIG. 10 is implemented.

The transistor-disconnected part 1003 in FIG. 10 is implementable by changing a mask in such a manner that the via plug 1102 illustrated in FIG. 11(A) is not formed, and that the via plug 1101 in FIG. 11(A) is not formed. Manufacturing with use of the thus changed mask results in a structure illustrated in FIG. 11(B). At this time, a mask is changed in such a manner that the via plugs 1103a and 1103b are formed at positions where the second wiring 1106 and the first wirings 1104a and 1104b overlap each other in a vertical direction. Accordingly, the second wiring 1106 is insulated from the via plug 1105 formed in the lower-layer interlayer-insulating film, and is not connected with the cell transistor (programmable transistor). The transistor-disconnected part 1003 in FIG. 10 is thus implemented.

Using the method according to the present exemplary embodiment, a resistance variable element is replaceable with a via plug in a short circuit state or an insulation state. A state thereof becomes apparent by mapping functions, and changes depending on an operation function desired to be equipped.

Further, since a parasitic capacitance component of a cell transistor can be reduced at a time of hard copy by eliminating a via plug connecting to a programming transistor, it becomes possible to perform a high-speed operation and a low-electric power operation. For example, when a cell transistor has a parasitic capacitance of 1 fF, the amount reaches 10 nF in total when the number of resistance variable elements mounted is 10 Mbit, and thus, it is possible to reduce electric power to be consumed by a chip for this amount.

The via plugs 1101, 1102, 1103, and 1104 according to the present exemplary embodiment are of the same layer. Consequently, it becomes possible to separately create a reconfigurable circuit using a resistance variable element and a hard copy merely by changing a single mask for fabricating a via plug, and a cost can be reduced.

In the above, the present invention has been described in association with the preferred exemplary embodiments and examples. However, the exemplary embodiments and examples are intended only for describing the invention with specific examples, and are not for limiting the invention. Various modifications which a person skilled in the art can understand can be applied to the configurations and details of the invention of the present application within the scope of the invention of the present application.

For example, the semiconductor substrate base for forming a hard copy according to the present invention includes a crossbar switch block, a logic block (for example, a look-up-table (LUT)), and the like, which are the same as those in a reconfigurable circuit chip. In the semiconductor substrate base, a connection state of the switch block and configuration information on the LUT are arbitrarily programmed by a resistance variable element. At this time, a hard copy chip is configured in such a manner that whether or not to form a via at a position of the resistance variable element is selectable by a single mask while having the same structure, thereby fabricating the semiconductor substrate base from which a program mechanism is eliminated. Since the program mechanism is eliminated, a high voltage transistor for programming the resistance variable element becomes unnecessary, and a chip area can be reduced.

For example, a reconfigurable circuit chip using a resistance variable element uses a high voltage transistor for programming the resistance variable element, and thus, using a leading-edge technology node (28 nm or thereafter) is less advantageous. Hence, a 65 to 40 nm generation technology node is used for forming the reconfigurable circuit chip. This can suppress a manufacturing cost for forming the reconfigurable circuit.

On the other hand, a semiconductor substrate for use in forming a hard copy, from which a high voltage transistor for programming the resistance variable element is eliminated, can be reduced in a chip size as miniaturization progresses. This allows using a 28 nm generation and a 14 nm generation, which are newer generations than a 40 nm generation, and it becomes possible to reduce electric power consumption.

For example, the resistance variable element according to the present invention has been described mainly about a metal crosslink type resistance variable element. However, the present invention is not limited to the material of the resistance variable element. For example, the present invention can also be used when hard copying a circuit which uses a resistance variable element such as a magnetic RAM (MRAM), a phase change random access memory (PRAM), a ReRAM, or the like.

For example, a detailed description has been given about a technology of a device for manufacturing a semiconductor having a CMOS circuit, which is an application field as a background of the invention made by the present inventor, and a description has been given as to an example in which a resistance variable element is formed above a copper wiring on a semiconductor substrate. However, the present invention is not limited thereto. The present invention is also applicable to a semiconductor product having a memory circuit, a semiconductor product having a logic circuitry such as a microprocessor, or on a copper wiring of a board or a package including these semiconductor products simultaneously mounted thereon. Examples of the memory circuit herein include a dynamic RAM (DRAM), an SRAM, a flash memory, a ferro electric RAM (FRAM) (Registered Trademark), an MRAM, a resistance-variable memory, and a bipolar transistor.

In addition, the present invention is also applicable for joining an electronic circuit device, an optical circuit device, a quantum circuit device, a micro machine, a micro electro mechanical systems (MEMS), and the like to a semiconductor device. In addition, the present invention has been described mainly on the examples in terms of a switching function. However, the present invention can also be used in a memory element or the like which utilizes both a non-volatile property and a resistance-variable property.

In addition, the present invention can be confirmed in a hard copy by whether a configuration of a routing switch as indicated herein is used.

A part or all of the above-described exemplary embodiments or the examples can be described as the following supplementary notes, but the present invention is not limited to the following.

(Supplementary Note 1) A method of manufacturing a semiconductor device for manufacturing a hard copy from a reconfigurable circuit chip using a resistance-variable non-volatile element formed inside a multi-layered wiring layer on a semiconductor substrate, wherein a hard copy is manufactured by using a semiconductor substrate base being same as that of a semiconductor substrate forming the reconfigurable circuit chip.

(Supplementary Note 2) The method of manufacturing a semiconductor device according to Supplementary note 1, wherein a hard copy is manufactured in such a manner that a lower wiring and an upper wiring planarly overlapping with each other are short-circuited at a portion where the resistance-variable non-volatile element of the reconfigurable circuit chip is programmed to a low-resistance state, and a lower wiring and an upper wiring planarly overlapping with each other are electrically insulated at a portion where the resistance-variable non-volatile element of the reconfigurable circuit chip is programmed to a high-resistance state.

(Supplementary Note 3) The method of manufacturing a semiconductor device according to Supplementary note 2, wherein a position of the resistance-variable non-volatile element programmed to a low-resistance state during mapping of a reconfigurable circuit is specified, and a circuit layout at a time of hard copy is formed in such a manner that a via plug is formed in the multi-layered wiring layer at a position of the low-resistance state element, and a via plug is not formed in the multi-layered wiring layer at a position of the high-resistance state element.

(Supplementary Note 4) The method of manufacturing a semiconductor device according to any one of Supplementary notes 1 to 3, wherein the manufactured hard copy includes the resistance-variable non-volatile element, the resistance-variable non-volatile element includes a wiring serving as a lower electrode, a resistance variable layer, and an upper electrode, the resistance variable layer is connected with the wiring serving as a lower electrode through an opening part of an insulating barrier film provided on the wiring serving as a lower electrode, the upper electrode is connected with an upper wiring through a contact plug, and, at a time of manufacturing a hard copy, a mask for forming an opening part in the insulating barrier film or a mask for forming a via plug for connecting the upper electrode with the upper wiring is changed and a circuit operation is implemented in a state in which only an electrode layer is mounted excluding a resistance variable layer from the resistance-variable non-volatile element.

(Supplementary Note 5) The method of manufacturing a semiconductor device according to any one of Supplementary notes 1 to 3, wherein the hard copy is manufactured by changing only a single mask in a multi-layered wiring process.

(Supplementary Note 6) The method of manufacturing a semiconductor device according to Supplementary note 5, wherein the manufactured hard copy includes the resistance-variable non-volatile element, the resistance-variable non-volatile element includes a wiring serving as a lower electrode, a resistance variable layer, and an upper electrode, the resistance variable layer is connected with the wiring serving as a lower electrode through an opening part of an insulating barrier film provided on the wiring serving as a lower electrode, the upper electrode is connected with an upper wiring through a contact plug, and the hard copy is manufactured by changing either one of a mask for forming an opening part in the insulating barrier film or a mask for forming a via plug for connecting the upper electrode with the upper wiring.

(Supplementary Note 7) The method of manufacturing a semiconductor device according to Supplementary note 6, wherein, at a time of manufacturing a hard copy, a circuit operation is implemented in a state in which only an electrode layer is mounted excluding a resistance variable layer from the resistance-variable non-volatile element.

(Supplementary Note 8) The method of manufacturing a semiconductor device according to any one of Supplementary notes 1 to 5, wherein the resistance-variable non-volatile element includes a wiring serving as a lower electrode, a resistance variable layer, and an upper electrode, and is configured such that the resistance variable layer is connected with the wiring serving as a lower electrode through an opening part of an insulating barrier film provided on the wiring serving as a lower electrode and the upper electrode is connected with an upper wiring through a contact plug, and, at a time of manufacturing a hard copy, a process of manufacturing the resistance-variable non-volatile element is eliminated and the hard copy is manufactured by changing a mask for forming a via plug for connecting the upper electrode with the upper wiring.

(Supplementary Note 9) The method of manufacturing a semiconductor device according to any one of Supplementary notes 1 to 7, wherein, at a time of manufacturing a hard copy, a mask for forming an opening part in the insulating barrier film or a mask for forming a via plug for connecting the upper electrode with the upper wiring is changed, and a circuit operation is implemented in a state in which only an electrode layer is mounted excluding a resistance variable layer from the resistance-variable non-volatile element.

(Supplementary Note 10) The method of manufacturing a semiconductor device according to any one of Supplementary notes 1 to 7, wherein the resistance-variable non-volatile element is used as a routing switch or a memory.

(Supplementary Note 11) The method of manufacturing a semiconductor device according to any one of Supplementary notes 1 to 8, wherein the resistance-variable non-volatile element is programmed through a cell transistor.

(Supplementary Note 12) The method of manufacturing a semiconductor device according to Supplementary note 11, wherein a wiring serving as a lower electrode includes a first wiring serving as a lower electrode and a second wiring serving as a lower electrode, the first and the second wirings serving as lower electrodes being arranged apart from each other and connected through the resistance variable layer of the resistance-variable non-volatile element, and configures a structure body in which two bipolar resistance-variable non-volatile elements are connected in series, and the cell transistor for programming the resistance-variable non-volatile element is connected with an intermediate node of the structure body.

(Supplementary Note 13) The method of manufacturing a semiconductor device according to Supplementary note 11 or 12, wherein a mask for forming the contact plug for connecting the upper electrode with the upper wiring is changed by eliminating a via for connecting the upper wiring with a cell transistor at a time of hard copy.

(Supplementary Note 14) The method of manufacturing a semiconductor device according to any one of Supplementary notes 11 to 13, wherein, at a time of manufacturing a hard copy, a mask for forming the resistance-variable non-volatile element is changed and a via plug for short-circuiting the upper wiring and the wiring serving as a lower electrode is formed.

(Supplementary Note 15) The method of manufacturing a semiconductor device according to Supplementary note 14, wherein a first wiring serving as a lower electrode and a second wiring serving as a lower electrode are short-circuited through the upper wiring by formation of a via plug for short-circuiting the upper wiring and the wiring serving as a lower electrode.

(Supplementary Note 16) A semiconductor device including a lower wiring formed on a semiconductor substrate, an interlayer-insulating film formed above the lower wiring, an upper wiring formed above the interlayer-insulating film at a position planarly overlapping with the lower wiring, and a resistance variable element formed between the lower wiring and the interlayer-insulating film at a position where the lower wiring and the upper wiring planarly overlap, wherein the resistance-variable non-volatile element including a resistance variable layer is formed at a position where the lower wiring and the upper wiring planarly overlap, the resistance-variable non-volatile element includes a wiring serving as a lower electrode, the resistance variable layer, and an upper electrode, and is configured such that the resistance variable layer is connected with the wiring serving as a lower electrode through an opening part of an insulating barrier film provided on the wiring serving as a lower electrode and the upper electrode is connected with an upper wiring through a contact plug, and the resistance-variable non-volatile element is not formed, and the lower wiring and the upper wiring are short-circuited, at a first portion of a position where the lower wiring and the upper wiring planarly overlap.

(Supplementary Note 17) The semiconductor device according to Supplementary note 16, wherein an opening part is not formed in the insulating barrier film, and the resistance-variable non-volatile element and the wiring serving as a lower electrode are insulated by the insulating barrier film, at a second portion different from the first portion.

(Supplementary Note 18) The semiconductor device according to Supplementary note 16, wherein the wiring serving as a lower electrode of the resistance-variable non-volatile element includes a first wiring serving as a lower electrode and a second wiring serving as a lower electrode, the first and the second wirings serving as lower electrodes being arranged apart from each other and connected through the resistance variable layer of the resistance-variable non-volatile element, and configures a structure body in which two bipolar resistance-variable non-volatile elements are connected in series.

(Supplementary Note 19) The semiconductor device according to Supplementary note 18, wherein the resistance-variable non-volatile element is not formed, and the first wiring serving as a lower electrode and the second wiring serving as a lower electrode are short-circuited through the upper wiring, at a third portion different from the first portion.

(Supplementary Note 20) The semiconductor device according to Supplementary note 18 or 19, wherein an opening part is not formed in the insulating barrier film, and the first and the second wirings serving as lower electrodes and the upper wiring are insulated, at a fourth portion different from the first portion.

(Supplementary Note 21) A method of manufacturing a hard copy chip, wherein configuration information is acquired from a reconfigurable circuit chip achieving an operation function in accordance with a program state of a resistance-variable non-volatile element formed inside a multi-layered wiring layer on a semiconductor substrate, and a semiconductor substrate having the same function is manufactured.

(Supplementary Note 22) A semiconductor device manufactured by the manufacturing method according to Supplementary note 21, the semiconductor device including a same number of logic blocks as a number of logic blocks mounted on the reconfigurable circuit chip.

(Supplementary Note 23) A semiconductor device hard-copied so as to have a same logical operation function as a reconfigurable circuit chip including a resistance-variable non-volatile element formed inside a multi-layered wiring layer on a semiconductor substrate, the resistance-variable non-volatile element having an arbitrary logical operation function being programmed.

(Supplementary Note 24) The semiconductor device according to Supplementary note 23, wherein the reconfigurable circuit chip includes a logic block and a switch block, and the resistance-variable non-volatile element is used for the both blocks.

(Supplementary Note 25) The semiconductor device according to Supplementary note 24, wherein logic cells including the switch block and the logic block are laid in a shape of tiles.

(Supplementary Note 26) The semiconductor device according to any one of Supplementary notes 23 to 25, wherein the switch block includes a crossbar switch.

(Supplementary Note 27) The semiconductor device according to any one of Supplementary notes 23 to 26, wherein a lower wiring and an upper wiring planarly overlapping with each other are short-circuited at a portion where the resistance-variable non-volatile element of the reconfigurable circuit chip is programmed to a low-resistance state, and a lower wiring and an upper wiring planarly overlapping with each other are electrically insulated at a portion where the resistance-variable non-volatile element of the reconfigurable circuit chip is programmed to a high-resistance state.

(Supplementary Note 28) The semiconductor device according to Supplementary note 27, wherein at least one via plug is formed at the portion programmed to a low-resistance state.

(Supplementary Note 29) A method of manufacturing the semiconductor device according to Supplementary note 27 or 28, wherein a position of the resistance-variable non-volatile element programmed to a low-resistance state during mapping of a reconfigurable circuit is specified, and a layout at a time of hard copy is formed by forming at least one via plug in the multi-layered wiring layer at the position of the low-resistance state element.

(Supplementary Note 30) The method of manufacturing the semiconductor device, according to Supplementary note 29, wherein the hard copy is manufactured by changing only a single mask in a multi-layered wiring process.

(Supplementary Note 31) The method of manufacturing the semiconductor device, according to Supplementary note 29 or 30, wherein a hard copy is manufactured by using a semiconductor substrate base being same as that of a semiconductor substrate forming the reconfigurable circuit chip.

(Supplementary Note 32) The method of manufacturing the semiconductor device, according to any one of Supplementary notes 29 to 31, wherein the resistance-variable non-volatile element includes a wiring serving as a lower electrode, a resistance variable layer, and an upper electrode, and is configured such that the resistance variable layer is connected with the wiring serving as a lower electrode through an opening part of an insulating barrier film provided on the wiring serving as a lower electrode and the upper electrode is connected with an upper wiring through a contact plug, and, at a time of manufacturing a hard copy, a process of manufacturing the resistance-variable non-volatile element is eliminated and the hard copy is manufactured by changing a mask for forming a via plug for connecting the upper electrode with the upper wiring.

In the above, the present invention has been described using each of the exemplary embodiments described above as an exemplary example. However, the present invention is not limited to the above-described exemplary embodiments. In other words, various modes that a person skilled in the art can understand can be applied to the present invention within the scope of the present invention.

This application is based upon and claims the benefit of priority from Japanese Patent Application No. 2014-130223, filed on Jun. 25, 2014, the disclosure of which is incorporated herein in its entirety by reference.

REFERENCE SIGNS LIST 1, 201, 301, 401, 901, 902 resistance variable element
402 logic block
403 connection block
404 switch block
501 low-resistance-state resistance variable element
502 high-resistance-state resistance variable element
1001 short circuit part
1002 insulation part
1003 transistor-disconnected part

The invention claimed is:

1. A semiconductor device hard-copied so as to have a same logical operation function as a reconfigurable circuit chip, comprising a resistance-variable non-volatile element formed inside a multi-layered wiring layer on a semiconductor substrate, the resistance-variable non-volatile element having an arbitrary logical operation function being programmed, wherein a lower wiring and an upper wiring planarly overlapping with each other are short-circuited at a portion where the resistance-variable non-volatile element of the reconfigurable circuit chip is programmed to a low-resistance state, and a lower wiring and an upper wiring planarly overlapping with each other are electrically insulated at a portion where the resistance-variable non-volatile element of the reconfigurable circuit chip is programmed to a high-resistance state.

2. The semiconductor device according to claim 1, wherein
the reconfigurable circuit chip includes a logic block and a switch block, and
the resistance-variable non-volatile element is used for the both blocks.

3. The semiconductor device according to claim 2, wherein
logic cells including the switch block and the logic block are laid in a shape of tiles.

4. The semiconductor device according to claim 1, wherein
the switch block includes a crossbar switch.

5. The semiconductor device according to claim 1, wherein
at least one via plug is formed at the portion programmed to the low-resistance state.

6. A method of manufacturing the semiconductor device according to claim 1, wherein
a position of the resistance-variable non-volatile element programmed to a low-resistance state during mapping of a reconfigurable circuit is specified, and a layout at a time of hard copy is formed by forming at least one via plug in the multi-layered wiring layer at the position of the low-resistance state element.

7. The method of manufacturing the semiconductor device, according to claim 6, wherein
the hard copy is manufactured by changing only a single mask in a multi-layered wiring process.

8. The method of manufacturing the semiconductor device, according to claim 6, wherein
a hard copy is manufactured by using a semiconductor substrate base being same as that of a semiconductor substrate forming the reconfigurable circuit chip.

9. The method of manufacturing the semiconductor device, according to claim 6, wherein the resistance-variable non-volatile element includes a wiring serving as a lower electrode, a resistance variable layer, and an upper electrode, and is configured such that the resistance variable layer is connected with the wiring serving as a lower electrode through an opening part of an insulating barrier film provided on the wiring serving as a lower electrode and the upper electrode is connected with an upper wiring through a contact plug, and, at a time of manufacturing a hard copy, a process of manufacturing the resistance-variable non-volatile element is eliminated and the hard copy is manufactured by changing a mask for forming a via plug for connecting the upper electrode with the upper wiring.

\* \* \* \* \*